(12) United States Patent
Bjornsen

(10) Patent No.: US 6,970,120 B1
(45) Date of Patent: Nov. 29, 2005

(54) METHOD AND APPARATUS FOR START-UP OF ANALOG-TO-DIGITAL CONVERTERS

(75) Inventor: Johnny Bjornsen, Trondheim (NO)

(73) Assignee: NORDIC Semiconductor ASA, Tiller (NO)

( * ) Notice: Subject to any disclaimer, the term of this patent is extended or adjusted under 35 U.S.C. 154(b) by 0 days.

(21) Appl. No.: 10/866,438

(22) Filed: Jun. 12, 2004

(51) Int. Cl.[7] .............................................. H03M 1/10
(52) U.S. Cl. ........................ 341/120; 341/155; 341/118
(58) Field of Search ........................ 341/120, 118, 155, 341/161

(56) References Cited

U.S. PATENT DOCUMENTS

| | | | | |
|---|---|---|---|---|
| 5,471,209 A | * | 11/1995 | Sutterlin et al. | ............. 341/143 |
| 6,348,885 B1 | * | 2/2002 | Munoz et al. | ............. 341/120 |
| 6,417,794 B1 | * | 7/2002 | Munoz et al. | ............. 341/120 |
| 6,486,806 B1 | * | 11/2002 | Munoz et al. | ............. 341/120 |
| 6,839,650 B2 | * | 1/2005 | Sutton et al. | ............. 702/123 |

* cited by examiner

*Primary Examiner*—Lam T. Mai
(74) *Attorney, Agent, or Firm*—Marshall, Gerstein & Borun LLP

(57) ABSTRACT

An analog-to-digital (ADC) converter circuit that converts an analog input signal into a digital output circuit includes a calibration coefficient computation circuit for computing calibration coefficients of a calibration filter. The calibration coefficient computation circuit includes a switching device adapted to switch the analog input signal delivered to the ADC circuit between on and off states, and includes a pseudo-random signal generator adapted to input a pseudo-random signal to the ADC circuit. During a start-up phase of the ADC circuit, the ADC circuit, the switching device turns off the analog input signal to the ADC circuit, the pseudo-random signal generator inputs a pseudo-random signal into the ADC circuit, and the calibration coefficient computation circuit computes the calibration coefficients of the calibration filter. This ADC circuit configuration reduces startup time for the calibration filter to only a few clock cycles.

37 Claims, 8 Drawing Sheets

METHOD AND APPARATUS FOR START-UP OF ANALOG-TO-DIGITAL CONVERTERS

TECHNICAL FIELD

This patent relates generally to analog-to-digital converters, and more specifically to an apparatus and a method for calibrating analog-to-digital converters.

BACKGROUND

Analog-to-digital converters (ADCs) are employed in a variety of electronic systems including computer modems, wireless telephones, satellite receivers, process control systems, etc. Such systems demand cost-effective ADCs that can efficiently convert an analog input signal to a digital output signal over a wide range of frequencies and signal magnitudes with minimal noise and distortion.

An ADC typically converts an analog signal to a digital signal by sampling the analog signal at pre-determined sampling intervals and generating a sequence of binary numbers via a quantizer, wherein the sequence of binary numbers is a digital representation of the sampled analog signal. Some of the commonly used types of ADCs include integrating ADCs, Flash ADCs, pipelined ADCs, successive approximation register ADCs, Delta-Sigma ($\Delta_\Sigma$) ADCs, two-step ADCs, etc. Of these various types, the pipelined ADCs and the $\Delta_\Sigma$ ADCs are particularly popular in applications requiring higher resolutions.

A pipelined ADC circuit samples an analog input signal using a sample-and-hold circuit to hold the input signal steady and a first stage flash ADC to quantize the input signal. The first stage flash ADC then feeds the quantized signal to a digital-to-analog converter (DAC). The pipelined ADC circuit subtracts the output of the DAC from the analog input signal to get a residue signal of the first stage. The first stage of the pipelined ADC circuit generates the most significant bit (MSB) of the digital output signal. The residue signal of the first stage is gained up by a factor and fed to the next stage. Subsequently, the next stage of the pipelined ADC circuit further quantizes the residue signal to generate a further bit of the digital output signal, with this process being repeated for each stage of the ADC circuit.

On the other hand, a $\Delta_\Sigma$ ADC employs over-sampling, noise-shaping, digital filtering and digital decimation techniques to provide high resolution analog-to-digital conversion. One popular design of a $\Delta_\Sigma$ ADC is a multi-stage noise shaping (MASH) $\Delta_\Sigma$ ADC. A MASH $\Delta_\Sigma$ ADC is based on cascading multiple first-order or second-order $\Delta_\Sigma$ ADCs to realize high-order noise shaping.

While both pipelined ADCs and $\Delta_\Sigma$ ADCs provide improved signal-to-noise ratio, improved stability, etc., the performance of both pipelined ADCs and $\Delta_\Sigma$ ADCs is bottlenecked by the linearity of the internal DAC. For example, the gain error of a DAC used in the first stage of a pipelined ADC circuit contributes to the overall gain error of the pipelined ADC circuit. The gain error of an ADC can be defined as the amount of deviation between an ideal transfer function and a measured transfer function of the ADC. One method used to overcome the limitations imposed by the gain errors of various stages of ADCs is to digitally calibrate the gain errors using calibration filters.

An illustration of a known pipelined ADC circuit 10 calibrated for gain errors using a calibration filter is shown in FIG. 1. The pipelined ADC circuit 10 converts an analog input signal u into a digital output signal y. While a typical pipelined ADC circuit may consist of several ADC stages, the pipelined ADC circuit 10 is shown to have a first stage 12 and a backend ADC labeled $ADC_2$ 14, where $ADC_2$ 14 may include one or more subsequent stages. The first stage 12 includes an ADC labeled $ADC_1$ 16 and a digital-to-analog converter (DAC) labeled $DAC_1$ 18. The ideal gain of the first stage 12 is G as represented by an amplifier block 20. The first stage 12 partially quantizes the analog input signal u to provide a digital output d1. The digital output d1 is converted to an analog signal by $DAC_1$ 18 and subtracted from the input signal u to generate an error signal e. Subsequently, the error signal e is amplified by the ideal gain G within the amplifier 20 to generate an analog residue signal r of the first stage of the ADC circuit 10. The analog residue signal r is input to the $ADC_2$ 14 for further quantization. The quantization error of $ADC_1$ 16 is assumed to be $q_1$ and the quantization error of $ADC_2$ 14 is assumed to be $q_2$.

The pipelined ADC circuit 10 also includes a pseudo-random signal generator 22 that generates a pseudo-random signal $d_t$ (also known as a dither signal). The pipelined ADC circuit 10 uses the signal $d_t$ for calibrating the gain errors. The signal $d_t$ is amplified by ¼ and is added to the digital output of $ADC_1$ 16. The combined output of the $ADC_1$ 16 and $d_t$ which is represented by $d_1$, is input to the $DAC_1$ 18. Thus the signal $d_t$ flows through part of the first stage 12 and the $ADC_2$ 14 to the digital output signal y of the pipelined ADC circuit 10.

The pseudo-random signal $d_t$, the first stage digital output $d_1$, and the final digital output y are input into a calibration filter 24, which compares the pseudo-random signal $d_t$ to the digital output signal y. In a perfectly calibrated ADC circuit, there should be no residue of the pseudo-random signal $d_t$ in the output signal y. Therefore, based on the amount of traces of the pseudo-random signal $d_t$ signal found in the output signal y, the calibration filter 24 adjusts a calibration coefficient $l_0$ of a multiplier 26. A perfect calibration is obtained when there are no traces of the pseudo-random signal $d_t$ in the digital output signal y. The calibration filter 24 functions in an iterative fashion by monitoring the digital output signal y and correlating it with the pseudo-random signal $d_t$. Such correlation is generally performed using various components including a delay circuit 28, a correlator 30, an accumulator 32 and a digital quantizer 34.

While the calibration filter 24 used with the pipelined ADC circuit 10 of FIG. 1 calculates only the calibration coefficients related to gain errors of the pipelined ADC circuit, calibration filters used with other types of ADC circuits may calculate various other calibration coefficients. For example, a calibration filter used with a $\Delta_\Sigma$ ADC circuit calculates calibration coefficients related to a gain and an integrator pole of a first stage of the $\Delta_\Sigma$ ADC circuit using an iterative algorithm similar to the one described above.

One of the disadvantages with the implementations of calibration filters using an iterative algorithm described above is the long time, usually on order of million clock cycles, that is necessary for the calibration filters to converge to a correct set of filter coefficients. Specifically, the calibration filter 24 may have to iterate several million clock cycles before it converges on the ideal calibration settings for the pipelined ADC circuit 10. Moreover, because the correlator 30 of the calibration filter 24 is effected by the analog input signal u, to suppress the effect of the analog input signal u, the output of the correlator 30 is accumulated over several thousands of samples by the accumulator 32. Therefore, in a start-up phase of an ADC circuit using a calibration filter, a large number of measurements are required before the calibration filter converges. As a result, the total startup time for such a calibration filter may become exceedingly long.

Such a long startup time for computation of calibration coefficients results in a requirement for longer testing time for circuits using ADC components, sometimes over a minute for each component, which is a major problem for volume production of circuits using ADC components. To facilitate volume production of circuits using ADC components at a reasonable cost, it is necessary to reduce the startup time required for ADC calibration filters.

BRIEF DESCRIPTION OF THE DRAWINGS

The present patent is illustrated by way of examples and not limitations in the accompanying figures, in which like references indicate similar elements, and in which.

DETAILED DESCRIPTION OF THE EXAMPLES

An analog-to-digital (ADC) converter circuit that converts an analog input signal into a digital output signal includes a calibration coefficient computation circuit for computing calibration filter coefficients. The calibration coefficient computation circuit includes a switching device adapted to switch the analog input signal delivered to the ADC circuit between on and off states, and includes a pseudo-random signal generator adapted to input a pseudo-random signal to the ADC circuit. During a start-up phase of the ADC circuit, the switching device turns off the analog input signal to the ADC circuit, the pseudo-random signal generator inputs a pseudo-random signal into the ADC circuit, and the calibration coefficient computation circuit computes the calibration coefficients of the calibration filter. This ADC circuit configuration reduces startup time for the calibration filter to only a few clock cycles. While the calibration coefficient computation circuit is described herein with a pipelined ADC circuit and a MASH $\Delta_\Sigma$ ADC circuit, it may also be used with various other types of ADC circuits.

Figure 1:
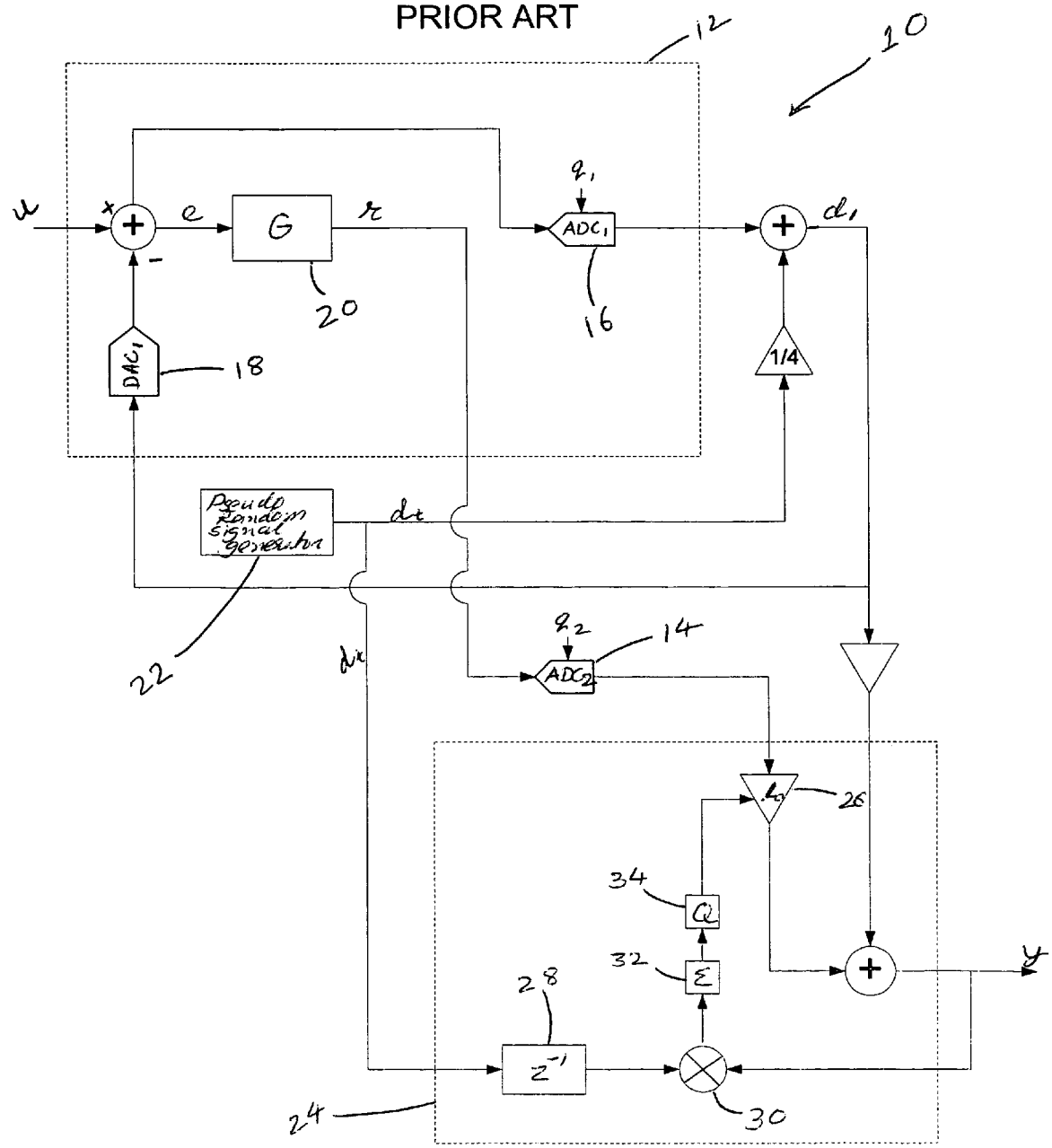
FIG. 1 is an exemplary block diagram of a pipelined ADC circuit calibrated for gain errors using a calibration filter.
Figure 2:
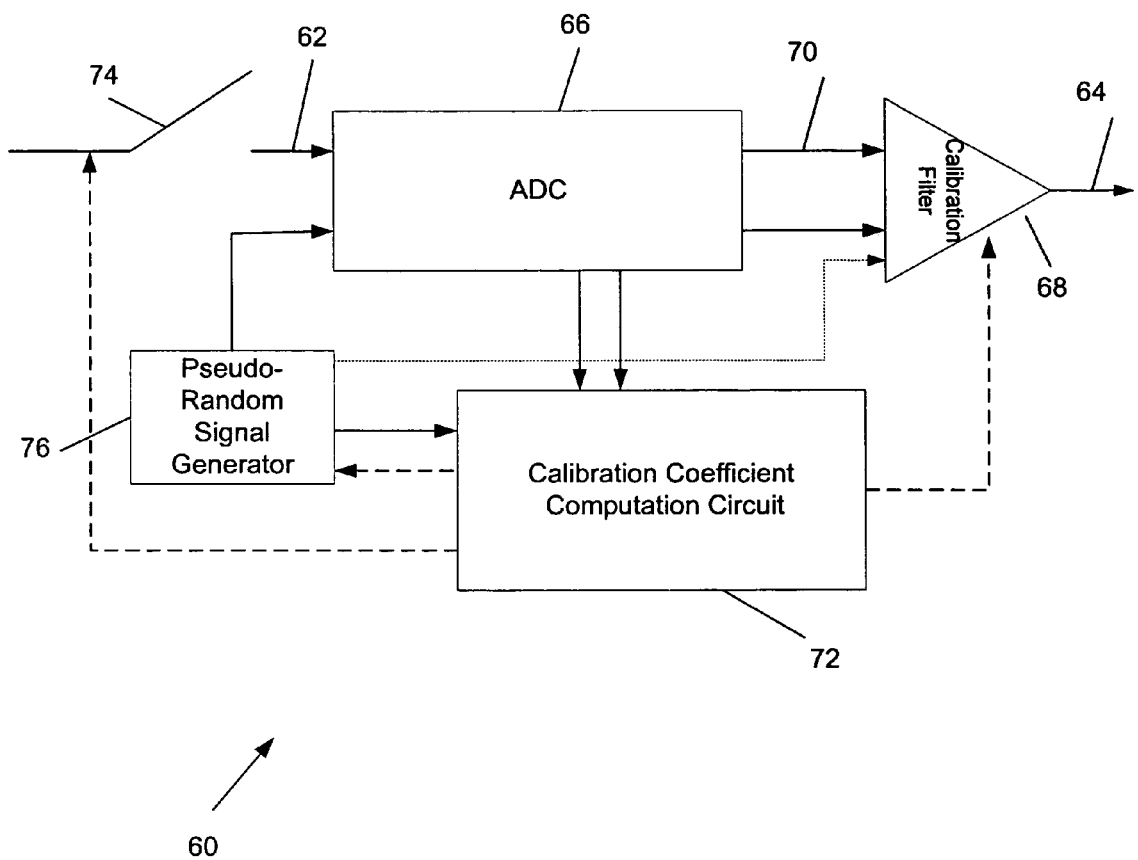
FIG. 2 is an exemplary block diagram of an ADC circuit using a fast startup method for computing calibration coefficients.

FIG. 2 illustrates an exemplary implementation of an ADC circuit 60 that converts an analog input signal at a terminal 62 into a digital output signal at a terminal 64. The ADC circuit 60 includes an ADC 66 that converts the analog input signal at the terminal 62 to a digital output signal 70 and a calibration filter 68 that filters the digital output 70. A calibration coefficient computation circuit 72 computes calibration coefficients for the calibration filter 68. Additionally, the computation circuit 72 controls a switching device 74 to turn on and turn off the analog input signal at the terminal 62 and controls a pseudo-random signal generator 76, which generates a pseudo-random signal input to the ADC 66 and the calibration filter 68.

Figure 3:
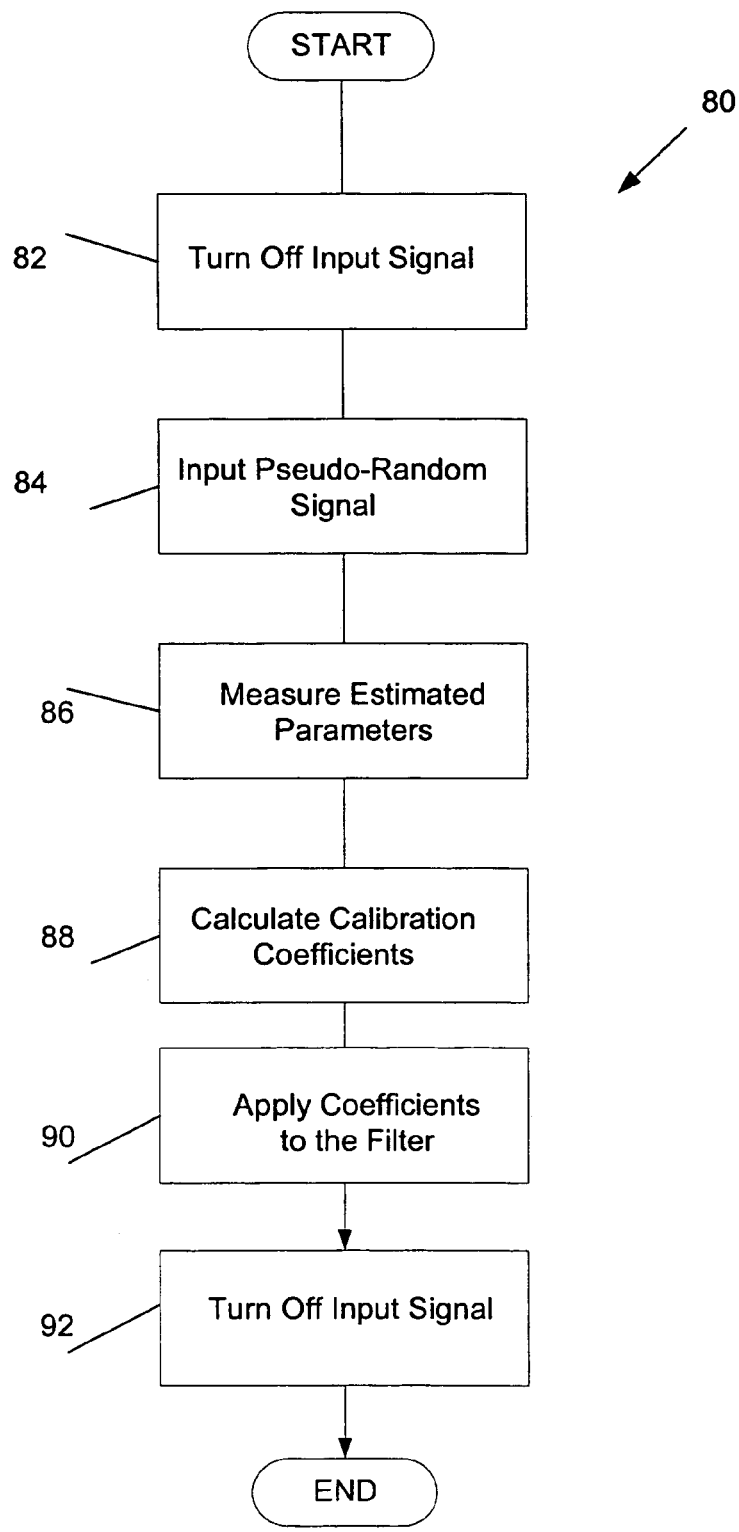
FIG. 3 is an exemplary flowchart illustrating the fast startup method for computing calibration coefficients for an ADC circuit.

Now referring to FIG. 3, a flowchart 80 illustrates a fast startup method that may be implemented by the computation circuit 72 for calculating calibration coefficients for the calibration filter 68. Various steps of the fast startup method illustrated by the flowchart 80 may be implemented by hardware, software, firmware or some combination thereof.

At the start of the fast startup method illustrated by the flowchart 80, a block 82 operates the switching device 74 to turn off the analog input signal being delivered to the ADC 66. Subsequently, with the analog input signal to the ADC 66 turned off, a block 84 inputs the pseudo-random signal generated by the pseudo-random signal generator 76 into the ADC 66. With the analog input signal to the ADC 66 turned off and only the pseudo-random signal input to the ADC 66, a block 86 measures various parameters of the ADC 66 and calculates various calibration parameters of the ADC 66. Such calibration parameters may include an estimated gain of the ADC 66, an estimated integrator pole of the ADC 60, etc. Some of the possible methodologies used for calculating the estimated gain and/or the estimated integrator pole of a pipelined ADC circuit and a MASH $\Delta_\Sigma$ ADC circuit are described below in further detail.

Upon calculating the estimated gain and/or the estimated integrator pole of the ADC 66, a block 88 calculates various coefficients used to control the calibration filter 68. The particular calculations used to determine such calibration coefficients depend on the implementation of the ADC 66 and exemplary calculations are discussed in further detail below with respect to a pipelined ADC circuit and a MASH $\Delta_\Sigma$ ADC circuit.

A block 90 delivers the calibration coefficients calculated at the block 88 to the calibration filter 68. The calibration filter 68 subsequently uses the calibration coefficients to filter the digital signal 70 output from the ADC 66. Finally, a block 92 operates the switching device 74 to turn on the analog input signal being delivered to the ADC 66.

Figure 4:
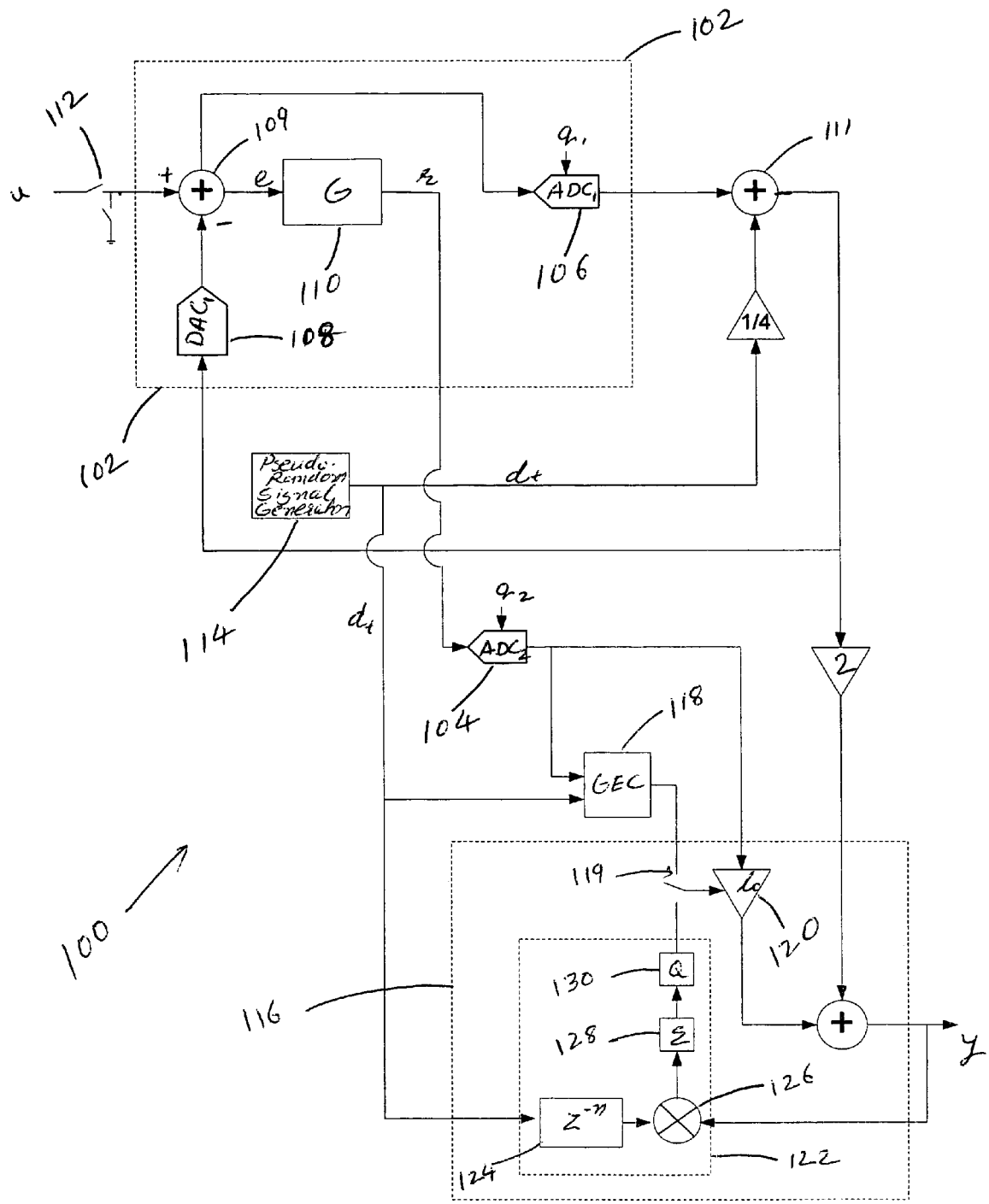
FIG. 4 is an exemplary block diagram of a gain calibrated pipelined ADC circuit including gain error correction logic that uses the fast startup method illustrated in FIG. 3.

FIG. 4 illustrates an implementation of the ADC circuit 60 as a pipelined ADC circuit 100. The pipelined ADC circuit 100 converts an analog input signal u into a digital output signal y. While a pipelined ADC circuit may consist of several ADC stages, the pipelined ADC circuit 100 is shown in FIG. 4 to have a first stage 102 and a backend ADC labeled $ADC_2$ 104, where $ADC_2$ 104 may include one or more subsequent stages. The first stage 102 includes an ADC labeled $ADC_1$ 106 and a digital-to-analog converter (DAC) labeled $DAC_1$ 108. For the purpose of this illustration, it is assumed that the ideal gain of this first stage 102 is two. However, the actual gain of the first stage 102 is represented by a block 110 as G, which may be different from two. As illustrated in FIG. 4, the analog input signal u can be turned on or turned off by a switching device 112.

The first stage 102 partially quantizes the analog input signal u to provide a digital output $d_1$ and feeds back the digital output $d_1$ to the feedback $DAC_1$ 108. The feedback $DAC_1$ 108 thus converts the digital output $d_1$ into an analog feedback signal. Subsequently, a summer 109 the first stage 102 subtracts the analog output of the feedback $DAC_1$ 108 from the analog input signal u to generate an error signal e. A block 110 amplifies the error signal e by the ideal gain G to generate an analog residue signal r of the first stage 102, and the analog residue signal r is input to the ADC$_2$ 104 for further quantization. The quantization error of the ADC$_1$ 106 is assumed to be q$_1$ and the quantization error of the ADC$_2$ 104 is assumed to be q$_2$.

The pipelined ADC circuit 100 also includes a pseudo-random signal generator 114 that generates a pseudo-random signal d$_t$ (also known as a dither signal), which is used for calibrating the gain errors. In particular, the signal d$_t$ is amplified by ¼ and is added to the digital output of the ADC$_1$ 106 by a summer 111. The combined output of the ADC$_1$ 106 and d$_t$ is input to the feedback DAC$_1$ 108. Thus the signal d$_t$ flows through part of the first stage 102 and the ADC$_2$ 104 to the digital output signal y of the pipelined ADC circuit 100.

The pipelined ADC circuit 100 also includes a calibration filter 116 and a calibration coefficient computation circuit 118, referred to as a gain error correction (GEC) circuit. The calibration filter 116 is used to calibrate an output d$_2$ of the ADC$_2$ 104. The calibration filter 116 includes a switching device 119 that controls which calibration co-efficient is used to control a gain filter 120. During normal operation of the ADC circuit 100, when the switching device 112 is turned on, thus allowing the analog input signal u to be delivered to the ADC circuit 100, the switching device 119 connects the control of the gain filter 120 to a continuous mode calibration circuit 122 comprising a delay 124, a correlator 126, an accumulator 128 and a quantizer 130. The continuous mode calibration circuit 122 functions in an iterative fashion by monitoring the digital output signal y and correlating it with the pseudo-random signal d$_t$ to obtain calibration coefficients for the gain filter 120.

On the other hand, during the startup phase, when the switching device 112 is turned off, thus blocking the analog input signal u from the ADC circuit 100, the switching device 119 connects the control of the gain filter 120 to the calibration coefficient computation circuit 118. As a result, during the startup phase, the calibration coefficient computation circuit 118, which computes the calibration coefficients used to control the gain filter 120, computes calibration coefficients using the transfer function of the pipelined ADC circuit 100. Based on the relationships between various signals at different stages of the pipelined ADC circuit 100, a transfer function of the pipelined ADC circuit 100 can be calculated as follows.

The difference of the analog input signal u and an output d$_1$ of the feedback 104, designated by the error signal e, can be calculated as:

$$e = u - d_1 = u - (u + q_1) = -q_1.$$

Given the ideal gain of the pipelined ADC circuit 100 as G, the input signal r to the second stage ADC$_2$ 104 can be calculated as:

$$r = Ge = -Gq_1.$$

Subsequently, the output signal d$_2$ of the second stage ADC$_2$ 104 can be calculated as:

$$d_2 = r + q_2 = -Gq_1 + q_2.$$

If the filter coefficient of the gain filter 120 is l$_0$, the output y of the pipelined ADC circuit 100 can be calculated as:

$$y = l_0 d_2 + 2d_1 = l_0(-Gq_1 + q_2) + 2(u + q_1) = 2u + 2q_1 - l_0 G q_1 + q_2.$$

For the pipelined ADC circuit 100 to be calibrated perfectly, there should be no leakage of the quantization error q$_1$ of the ADC$_1$ 106 to the output y of the pipelined ADC circuit 100. Thus, in the calculation of y above, the sum of the factors containing q$_1$ must equal zero, therefore:

$$2q_1 - l_0 G q_1 = 0.$$

Rearranging the equation above:

$$2 = l_0 G, \text{ as a result,}$$

$$l_0 = 2/G.$$

Thus, from the results above, for the pipelined ADC circuit 100, the coefficient l$_0$ of the gain filter 120 can be calculated directly if an estimate of the gain G can be found.

Figure 5:
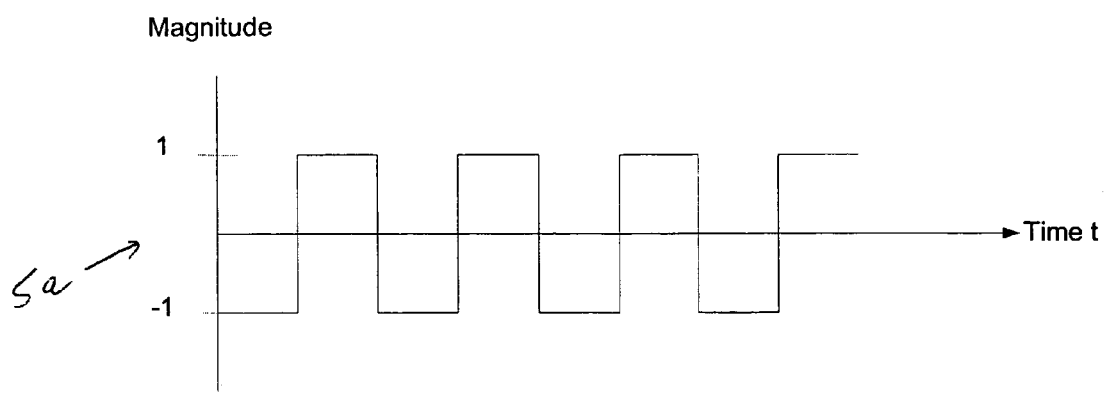
FIG. 5 is an exemplary signal diagram of digital pseudo-random signals at various stages of a continuously calibrated pipelined ADC.
Figure 5:
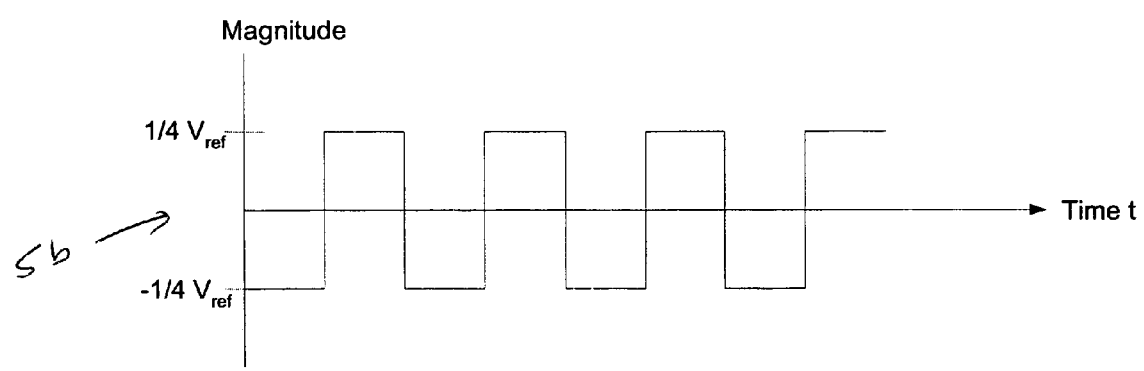
Figure 5:
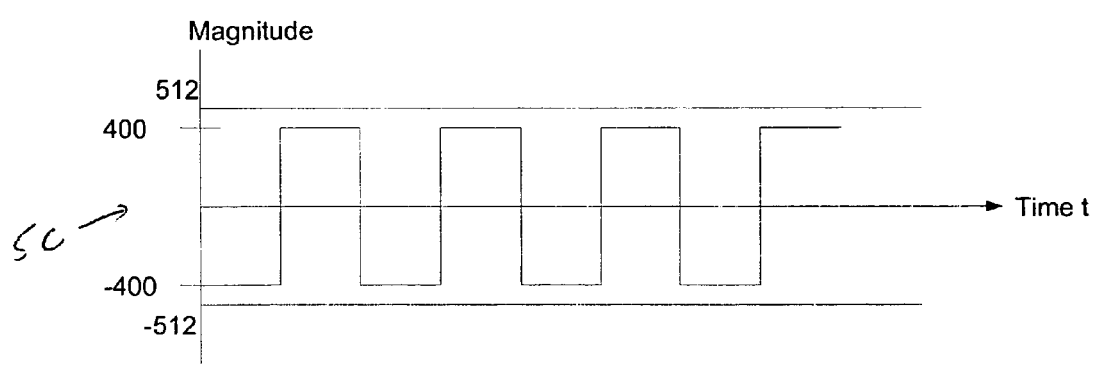

An estimate of gain G may be found by applying the fast startup method illustrated in the flowchart 80 of FIG. 2 to the pipelined ADC circuit 100. As a first step, the analog input signal u is grounded using the switching device 112. Subsequently, the pseudo-random signal d$_t$ is the only signal input to the feedback DAC$_1$ 108. Suppose the pseudo-random signal d$_t$ is as illustrated in FIG. 5a, having a magnitude of +/−1. As shown in FIG. 4, the pseudo-random signal d$_t$ is digitally added to the output of the ADC$_1$ 106 and goes through the feedback DAC$_1$ 108 of the first stage 102 of the pipelined ADC circuit 100. As a result, the pseudo-random signal d$_t$ is amplified with the same gain factor G as the analog input signal u would have been amplified by the first stage of the pipelined ADC circuit 100. The pseudo-random signal d$_t$ is amplified by ¼ before entering the feedback DAC$_1$ 108, and the ideal output of the feedback DAC$_1$ 108 is illustrated in FIG. 5b.

For illustration purpose, suppose that the ADC$_2$ 104 is a 12-bit ADC, i.e., it converts an analog input into a 12 bit output. If the quantized output d$_2$ of the ADC$_2$ 104 can be measured, then an estimate of the ideal gain G can be obtained to thereby determine the calibration coefficient l$_0$ of the calibration filter 120. The estimate of the quantized output of the ADC$_2$ 104 can be obtained from the output d$_2$ of the ADC$_2$ 104. FIG. 5c illustrates an exemplary sequence of an ideal output value of d$_2$ and an actual output value of d$_2$. Given that the ADC$_2$ 104 is a 12 bit output, the range of the output d$_2$ is +/−2048*¼=+/−512. FIG. 5c also shows the actual or observed value (+/−400) of the output d$_2$ in the presence of non-ideal gain. The calibration coefficient computation circuit 118 uses the actual output d$_2$ and the pseudo-random signal d$_t$ to calculate an estimate of gain G.

Figure 6:
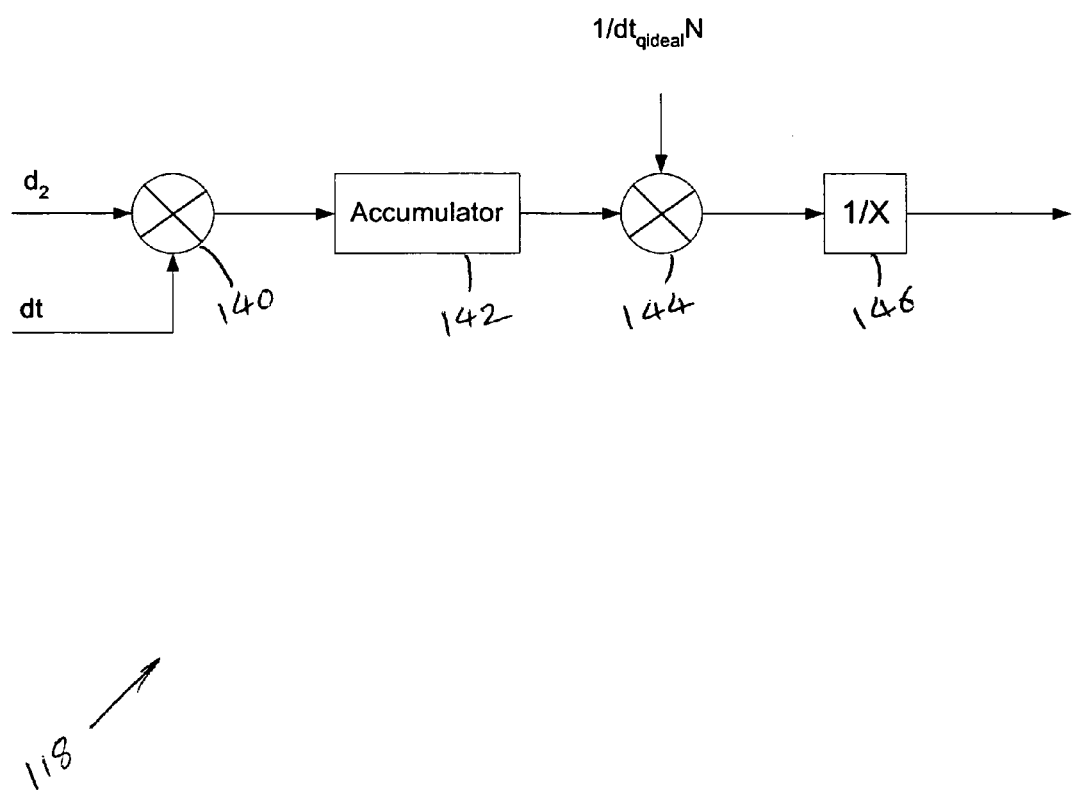
FIG. 6 is an exemplary block diagram of a gain error correction logic circuit used with a pipelined ADC calibrated for gain errors.

An implementation of the calibration coefficient computation circuit 114 is illustrated in FIG. 6 as a gain error correction (GEC) circuit 118. The GEC circuit 118 includes a correlator 140 that multiplies the output d$_2$ with the pseudo-random signal d$_t$. The output of the correlator 140 is summed and averaged by an accumulator 142. When the ADC$_2$ 104 is a 12 bit ADC, the expected value of the quantized d$_t$, given by d$_{tqideal}$ can be calculated based on FIG. 5c to be 512. Using the expected value of the quantized d$_t$, an estimate of the gain G may be obtained by the computation circuit using the following equation:

$$G = \frac{2}{dt_{qIdeal}} \frac{1}{N} \sum_N \text{sign}(dt) * d_2.$$

To calculate the value of estimated gain G, a multiplier 144 of the GEC circuit 118 multiplies the output of the accumulator 142 by 2/d$_{tqideal}$. As previously shown, the value of filter coefficient l$_0$ is given by a ratio of the ideal gain of the pipelined ADC circuit 100 and the estimated gain G of the pipelined ADC circuit 100. Therefore, the GEC circuit 118 includes an inverter 146 to invert the output of the multiplier 144. The following table gives an example of a computation of estimated gain for the pipelined ADC circuit 100 where the second stage $ADC_2$ 104 is a 12-bit ADC. The example below has been calculated under an assumption of 20.6 dB operational transconductive amplifier (OTA) gain for the pipelined ADC circuit 100, leading to an estimated gain of 1.5625.

| $d_r$ | $d_2$ | $d_2 sign(d_{r0})$ |
|---|---|---|
| 1 | 400 | 400 |
| 0 | −400 | 400 |
| 1 | 400 | 400 |
| 0 | −400 | 400 |
| 1 | 400 | 400 |
| 0 | −400 | 400 |
| 1 | 400 | 400 |
| 0 | −400 | 400 |
| 1 | 400 | 400 |
| 0 | −400 | 400 |
| Sum |  | 4000 |

Where the gain is calculated as follows:

$$G = \frac{2}{512}\frac{1}{10}\sum_{10} sign(dt) * d_2 = \frac{2}{512}\frac{1}{10}4000 = 1.5625.$$

Subsequently, the output of the GEC circuit 118 is multiplied by the ideal gain of the pipelined ADC circuit 100, which in this example is assumed to be equal to two, to get the filter coefficient $l_0$ as follows:

$$l_0 = \frac{2}{G} = \frac{2}{1.5625} = 1.28.$$

Figure 7:
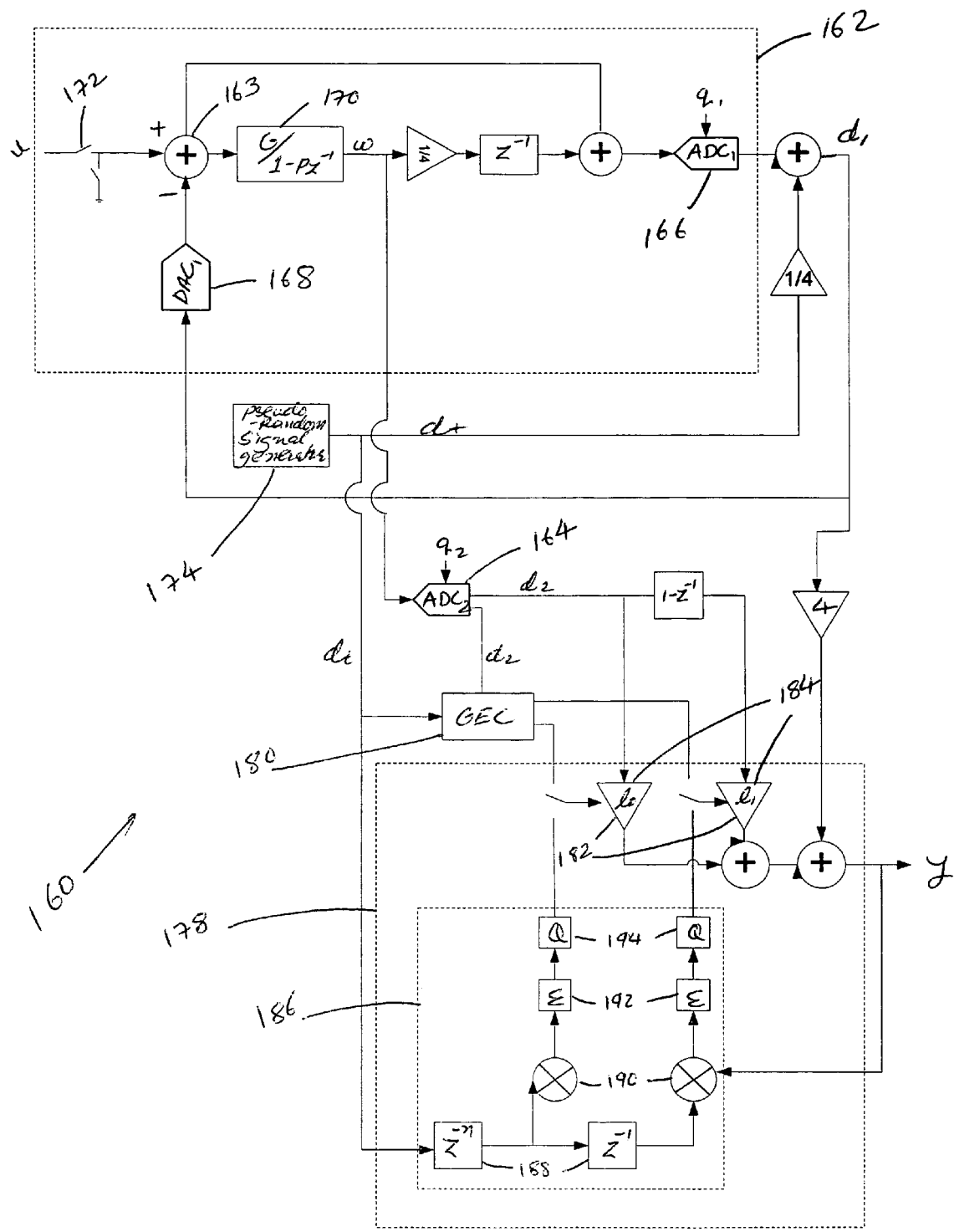
FIG. 7 is an exemplary block diagram of a MASH $\Delta_\Sigma$ ADC circuit using a calibration filter.

While the circuits of FIGS. 4 and 6 depict a pipelined implementation of the ADC circuit 100, FIG. 7 illustrates a MASH $\Delta_\Sigma$ implementation of an MASH $\Delta_\Sigma$ ADC circuit 160 using the fast startup method described in flowchart 80 for computing calibration filter coefficients. The MASH $\Delta_\Sigma$ ADC circuit 160 converts an analog input signal u into a digital output signal y. The MASH $\Delta_\Sigma$ ADC circuit 160 is shown to have a first stage 162 and a backend ADC labeled $ADC_2$ 164, where the $ADC_2$ 164 may include one or more subsequent stages. The first stage 162 includes an ADC labeled $ADC_1$ 166 and a DAC labeled $DAC_1$ 168. It is assumed that the actual gain of this first stage 162 is G and that the first stage 162 has one integrator having a pole p. The actual transfer function of the first stage 162 is illustrated by an integrator block 170. The analog input signal u is connected to the input of the MASH $\Delta_\Sigma$ ADC circuit 160 via a switching device 172. Quantization errors of the $ADC_1$ 166 and the $ADC_2$ 164 are, respectively, $q_1$ and $q_2$.

The first stage 162 converts the input signal u into a digital output signal, which is fed back through the feedback $DAC_1$ 168. A summer 163 within the first stage 162 subtracts an analog output of the $DAC_1$ 168 from the input signal u to generate a residue signal e. The integrator block 170 amplifies and integrates the residue signal e to generate a residue signal w, which is fed to the $ADC_2$ 164. The MASH $\Delta_\Sigma$ ADC circuit 160 also includes a pseudo-random signal generator 174 that generates a pseudo-random signal $d_r$, which is used to calibrate coefficients of a calibration filter 178. The pseudo-random signal $d_r$ is amplified by ¼ and is added to the digital output of the $ADC_1$ 166. The combined output of the $ADC_1$ 166 and $d_r$ is represented by $d_1$, which is input to the feedback $DAC_1$ 168. Thus, the signal $d_r$ flows through part of the first stage 162 and the $ADC_2$ 164 to the digital output signal y of the MASH $\Delta_\Sigma$ ADC circuit 160.

The MASH $\Delta_\Sigma$ ADC circuit 160 also includes a calibration coefficient computation circuit 180, which is implemented by a gain error correction (GEC) circuit. The calibration filter 178, which is used to calibrate an output $d_2$ of the $ADC_2$ 164, includes a switching device 182 that controls which calibration coefficients are used to control gain filters 184. During normal operation of the MASH $\Delta_\Sigma$ ADC circuit 160, when the switching device 172 is turned on, thus allowing the analog input signal u to be input to the MASH $\Delta_\Sigma$ ADC circuit 160, the switching device 182 connects the control of the gain filter 184 to a continuous mode calibration circuit 186 comprising delay units 188, correlators 190, accumulators 192 and quantizers 194. The continuous mode calibration circuit 186 functions in an iterative fashion by monitoring and correlating the digital output signal y and correlating it with the pseudo-random signal $d_r$ to obtain calibration coefficients for the gain filters 184.

On the other hand, during the startup phase, when the switching device 172 is turned off, thus blocking the analog input signal u from the MASH $\Delta_\Sigma$ ADC circuit 160, the switching device 182 connects the control of the gain filters 184 to the calibration coefficient computation circuit 180. During the startup phase, the calibration coefficient computation circuit 180 computes the calibration coefficients used to control the gain filter 184. The calibration coefficient computation circuit 180 computes calibration coefficients using the transfer function of the MASH $\Delta_\Sigma$ ADC circuit 160. Based on the relationships between various signals at different stages of the MASH $\Delta_\Sigma$ ADC circuit 160, a transfer function of the MASH $\Delta_\Sigma$ ADC circuit 160 can be calculated as follows:

$$w = (u - d_1)\left(\frac{G}{1 - pz^{-1}}\right)$$

$$d_1 = \frac{w}{4}z^{-1} + u + q_1$$

$$w = \left(u - \left(\frac{w}{4}z^{-1} + u + q_1\right)\right)\left(\frac{G}{1 - pz^{-1}}\right)$$

$$w(1 - pz^{-1}) = \frac{w}{4}z^{-1}G - q_1 G$$

$$w\left(1 - z^{-1}\left(p - \frac{G}{4}\right)\right) = -q_1 G$$

$$w = \frac{-q_1 G}{1 - z^{-1}\left(p - \frac{G}{4}\right)}$$

$$d_1 = \frac{w}{4}z^{-1} + u + q_1$$

$$d_1 = \frac{-q_1 G z^{-1}}{4\left(1 - z^{-1}\left(p - \frac{G}{4}\right)\right)} + u + q_1$$

$$d_1 = u + q_1\left(1 - \frac{G}{4}\frac{z^{-1}}{1 - z^{-1}\left(p - \frac{G}{4}\right)}\right)$$

$$d_2 = w + q_2$$

$$y_1 = 4d_1 + d_2(l_0 - l_1 z^{-1})$$

-continued $$y_1 = 4\left(u + q_1\left(1 - \frac{G}{4}\frac{z^{-1}}{1-z^{-1}\left(p-\frac{G}{4}\right)}\right)\right) + \left(\frac{-q_1 G}{1-z^{-1}\left(p-\frac{G}{4}\right)} + q_2\right)(l_0 - l_1 z^{-1})$$

$$y_1 = 4u + 4q_1 - \frac{Gz^{-1}q_1}{1-z^{-1}\left(p-\frac{G}{4}\right)} - \frac{q_1 G(l_0 - l_1 z^{-1})}{1-z^{-1}\left(p-\frac{G}{4}\right)} + q_2(l_0 - l_1 z^{-1})$$

For the MASH $\Delta_\Sigma$ ADC circuit 160 to be calibrated perfectly, there should be no leakage of the quantization error $q_1$ of the $ADC_1$ 166 to the output y of the MASH $\Delta_\Sigma$ ADC circuit 160. Thus, in the calculation of y above, the sum of the factors containing $q_1$ must equal zero. Therefore:

$$4q_1 - \frac{Gz^{-1}q_1}{1-z^{-1}\left(p-\frac{G}{4}\right)} - \frac{q_1 G(l_0 - l_1 z^{-1})}{1-z^{-1}\left(p-\frac{G}{4}\right)} = 0$$

$$4 - \frac{Gz^{-1}}{1-z^{-1}\left(p-\frac{G}{4}\right)} - \frac{G(l_0 - l_1 z^{-1})}{1-z^{-1}\left(p-\frac{G}{4}\right)} = 0$$

$$4\left(1 - z^{-1}\left(p - \frac{G}{4}\right)\right) - Gz^{-1} - Gl_0 + Gl_1 z^{-1} = 0$$

This leads to simultaneous requirements that the sum of all factors not containing $z^{-1}$ must also equal zero. Therefore:

$$4 - Gl_0 = 0$$

$$l_0 = 4/G$$

$$-4z^{-1}\left(p - \frac{G}{4}\right) - Gz^{-1} + Gl_1 z^{-1} = 0$$

$$-4p + G - G + Gl_1 = 0$$

$$l_1 = 4p/G$$

Thus, in order to calculate the filter coefficients $l_0$ and $l_1$, estimates of the gain G and the integrator pole p are necessary.

An estimate of the gain G may be found by applying the fast startup method of the flowchart 80 of FIG. 3 to the MASH $\Delta_\Sigma$ ADC circuit 160. As a first step, the analog input signal u is grounded using the switching device 172 and the integrator 170 is reset for every clock period. Subsequently, the pseudo-random signal $d_t$ is applied to the MASH $\Delta_\Sigma$ ADC circuit 160. Because the integrator 170 has no memory (as it is reset every clock period) and the analog input signal u is grounded, the output of the integrator 170 will correspond only to the pseudo-random signal $d_t$. Furthermore, any offset at the integrator input will be cancelled if the pseudo-random signal $d_t$ has a shape of an alternating square wave, similar to that illustrated in FIG. 5a. In this situation, it can be shown that an estimate of the gain G can be obtained as follows:

$$G = \frac{4}{dt_{dIdeal}} \frac{1}{N} \sum_N \text{sign}(dt) * d_2$$

Similarly, an estimate of the integrator pole p can be found by shorting the analog input signal u to zero (using the switching device 172) and resetting the integrator 170 at every second clock period. In this case, when the pseudo-random signal $d_t$ is applied, the output of the integrator 170 is a function of only the applied pseudo-random signal $d_t$ and the pseudo-random signal $d_t$ from the previous clock period. The analog output of the integrator 170 is given as:

$$w = G(p*dt_0 + dt_1).$$

An estimate of p may be found by rewriting the above equation and using the previous estimate of gain G, as follows:

$$p = \frac{w}{G*dt_0} - \frac{dt_1}{dt_0}$$

Because the digital signal $d_2$ is a digital representation of the output w, the output w can be replaced by the digital signal $d_2$. To suppress the effects of white noise and quantization noise, the terms of the equation above are summed and averaged, generating a sum of integrator pole p as follows:

$$\sum p = \frac{1}{G}\frac{1}{dt_{qIdeal}} \sum d_2 * \text{sign}(dt_0) - \sum \frac{\text{sign}(dt_1)}{\text{sign}(dt_0)}$$

Subsequently, the estimated value of p can be obtained by dividing the sum of p by a number of observations used in obtaining the sum, as follows:

$$p = \frac{1}{N}\left(\frac{1}{G}\frac{1}{dt_{qIdeal}}\right) \sum d_2 * \text{sign}(dt_0) - \sum \frac{\text{sign}(dt_1)}{\text{sign}(dt_0)}$$

The following table provides an example of a computation of an estimated gain G and estimated integrator pole p for the MASH $\Delta_\Sigma$ ADC circuit 160, where the $ADC_1$ 166 is an 11-bit ADC. The example below has been calculated under an assumption of 50 dB operational transconductive amplifier (OTA) gain for the MASH $\Delta_\Sigma$ ADC circuit 160, leading to an estimated gain G of 3.934 and estimated pole p of 0.987.

| Reset | dt | sequence | $d_2$ | sequence | $d_2*\text{sign}(dt_0)$ | $dt_1/dt_0$ |
|---|---|---|---|---|---|---|
| Yes | 1 | $dt_0$ | 245 | $d_{20}$ | | |
| No | 0 | $dt_1$ | −3 | $d_{21}$ | −3 | −1 |
| Yes | 1 | $dt_0$ | 245 | $d_{20}$ | | |
| No | 1 | $dt_1$ | 488 | $d_{21}$ | 488 | 1 |
| Yes | 0 | $dt_0$ | 245 | $d_{20}$ | | |
| No | 1 | $dt_1$ | 3 | $d_{21}$ | −3 | −1 |
| Yes | 0 | $dt_0$ | −245 | $d_{20}$ | | |
| No | 0 | $dt_1$ | −488 | $d_{21}$ | 488 | 1 |
| Yes | 0 | $dt_0$ | −245 | $d_{20}$ | | |
| No | 1 | $dt_1$ | 3 | $d_{21}$ | −3 | −1 |
| Yes | 0 | $dt_0$ | −245 | $d_{20}$ | | |

-continued

| Reset | dt | sequence | $d_2$ | sequence | $d_2$*sign($dt_0$) | $dt_1/dt_0$ |
|---|---|---|---|---|---|---|
| No | 1 | $dt_1$ | 3 | $d_{21}$ | −3 | −1 |
| Yes | 0 | $dt_0$ | −245 | $d_{20}$ | | |
| No | 1 | $dt_1$ | 3 | $d_{21}$ | −3 | −1 |
| Yes | 0 | $dt_0$ | −245 | $d_{20}$ | | |
| No | 0 | $dt_1$ | −488 | $d_{21}$ | 488 | 1 |
| Yes | 1 | $dt_0$ | 245 | $d_{20}$ | | |
| No | 1 | $dt_1$ | 488 | $d_{21}$ | 488 | 1 |
| Sum | | | | | 1937 | −1 |

Where the estimated integrator pole p is calculated as follows:

$$p = \frac{1}{N}\left(\frac{1}{G}\frac{1}{dt_{qIdeal}}\right)\sum d_2 * \text{sign}(dt_0) - \sum \frac{\text{sign}(dt_1)}{\text{sign}(dt_0)} =$$

$$\frac{1}{9}\left(\frac{1}{3.934}\frac{4}{250}*1937 - (-1)\right) = .0986$$

Figure 8:
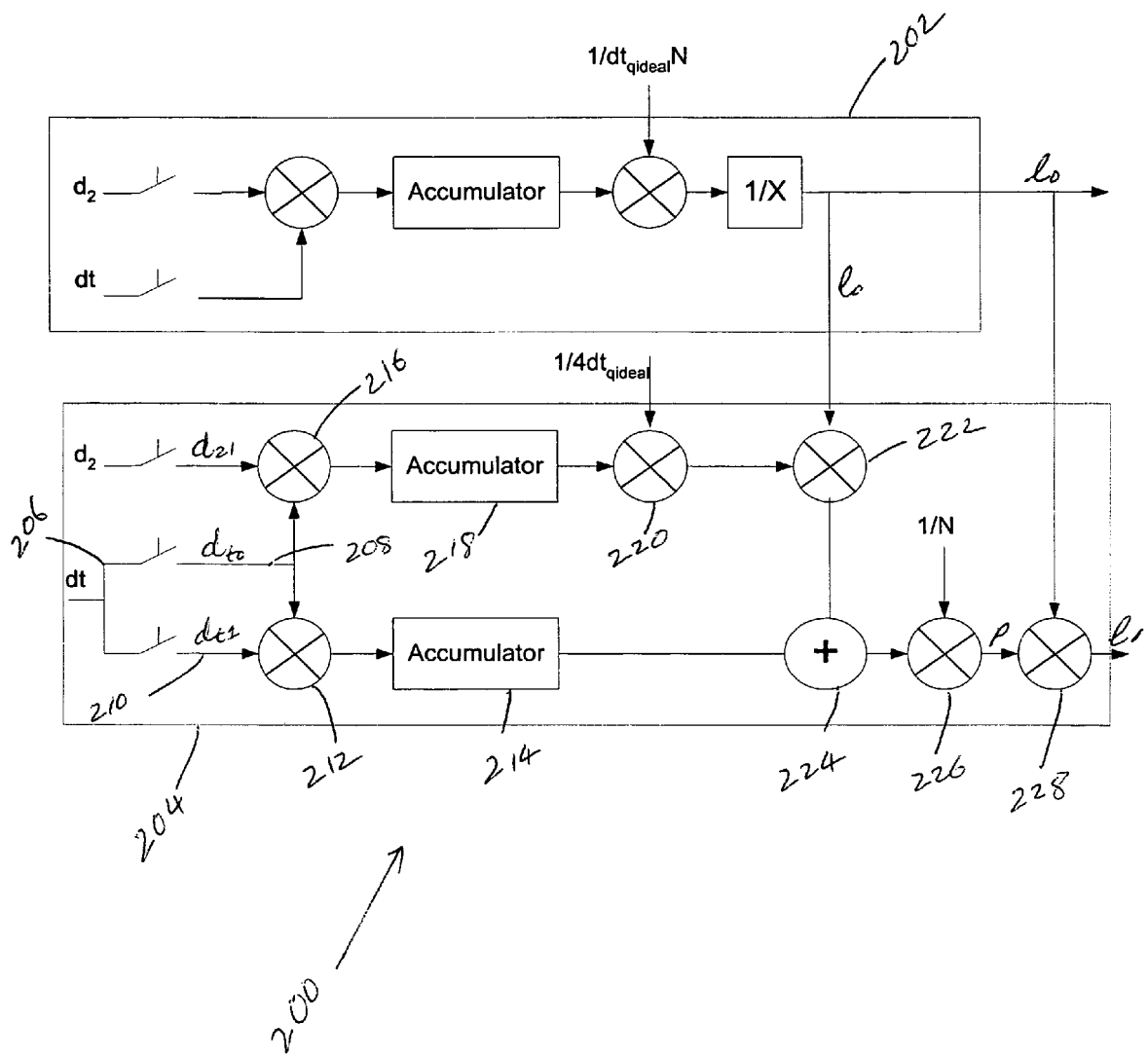
FIG. 8 is an exemplary block diagram of a gain error correction logic circuit used with a MASH $\Delta_\Sigma$ ADC circuit using a calibration filter.
Figure 1:
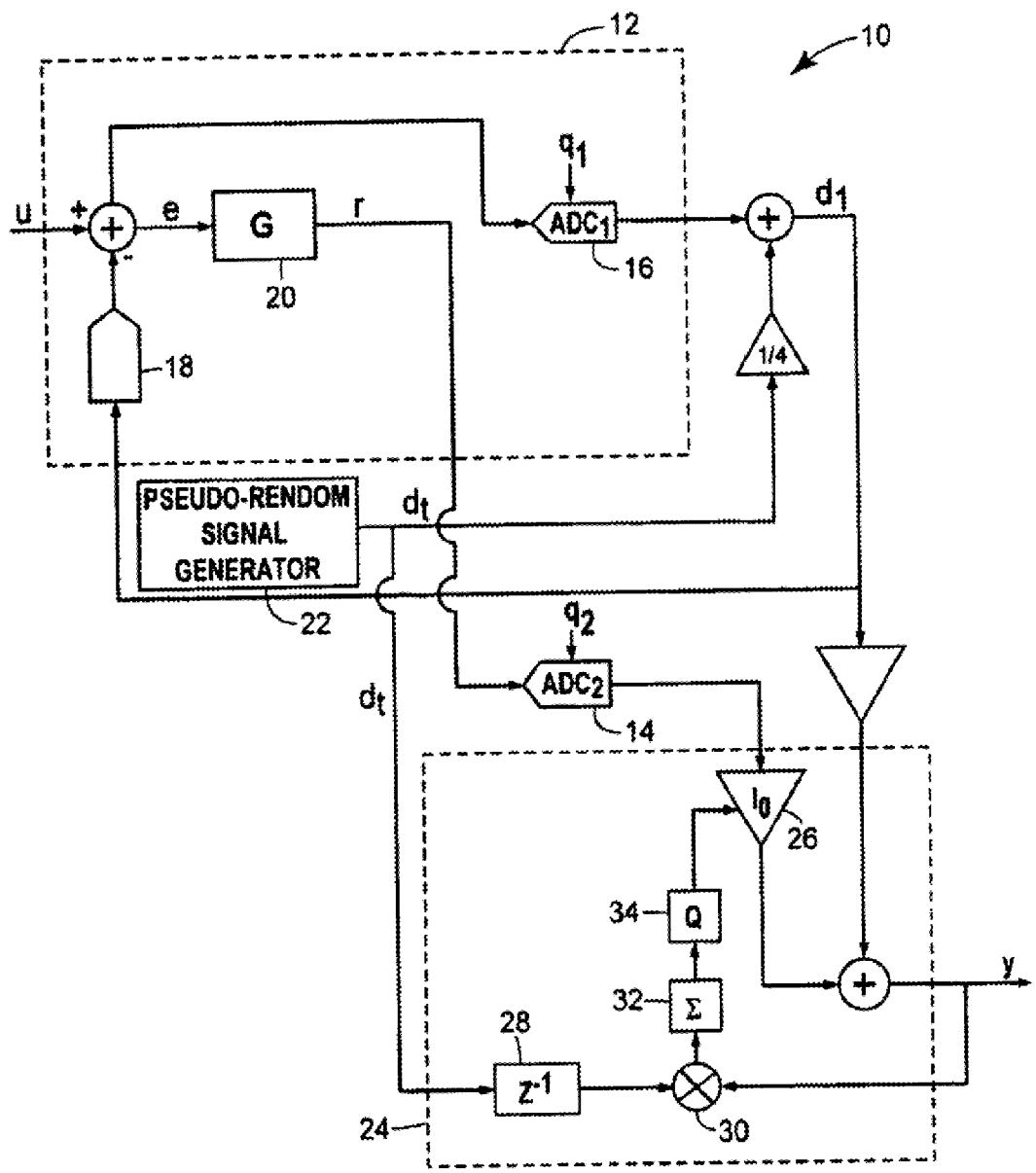
Figure 2:
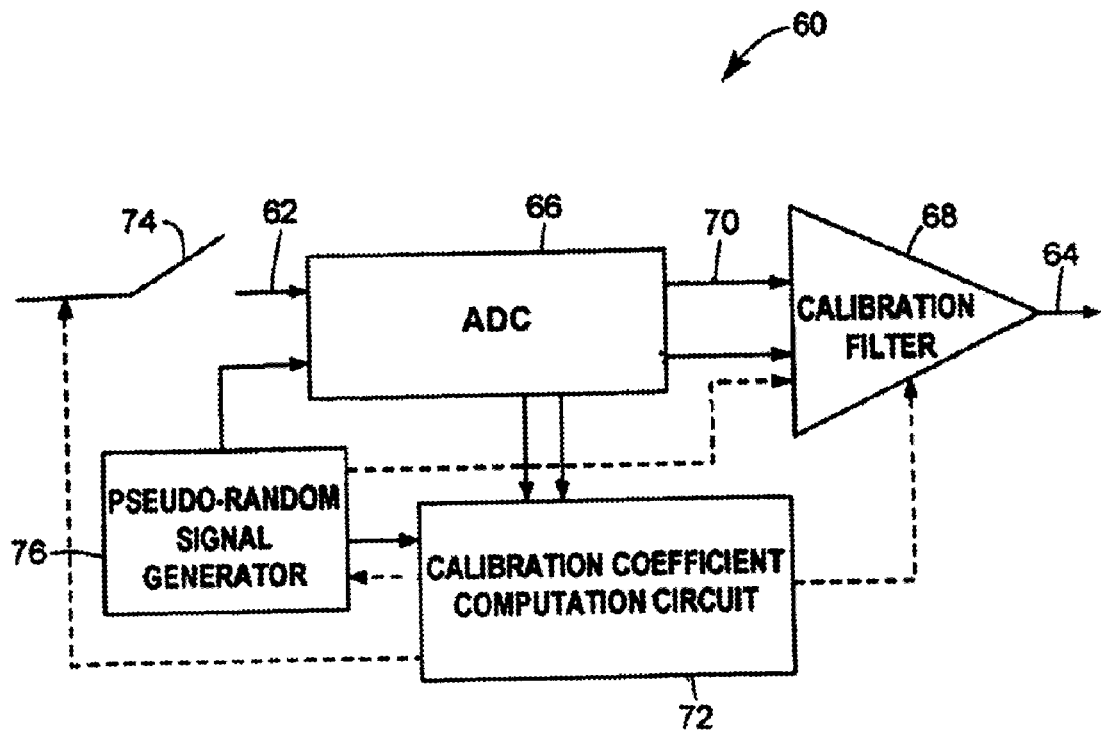
Figure 3:
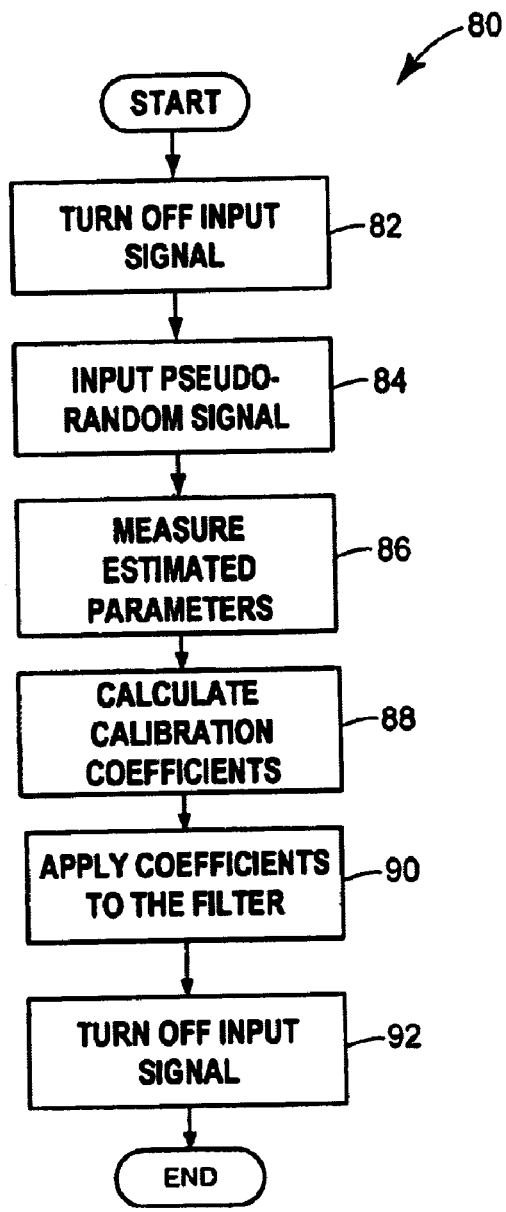
Figure 4:
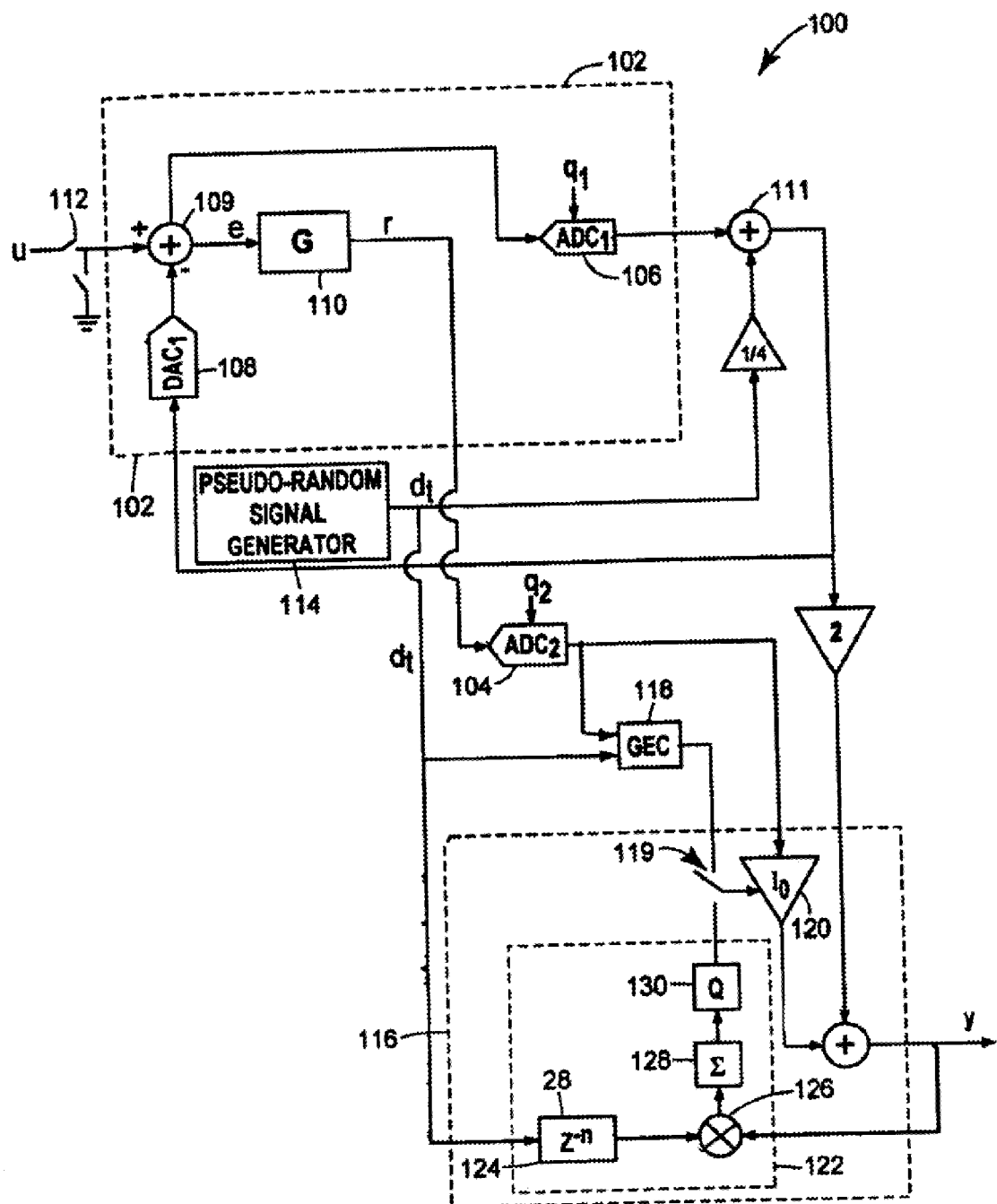
Figure 5:
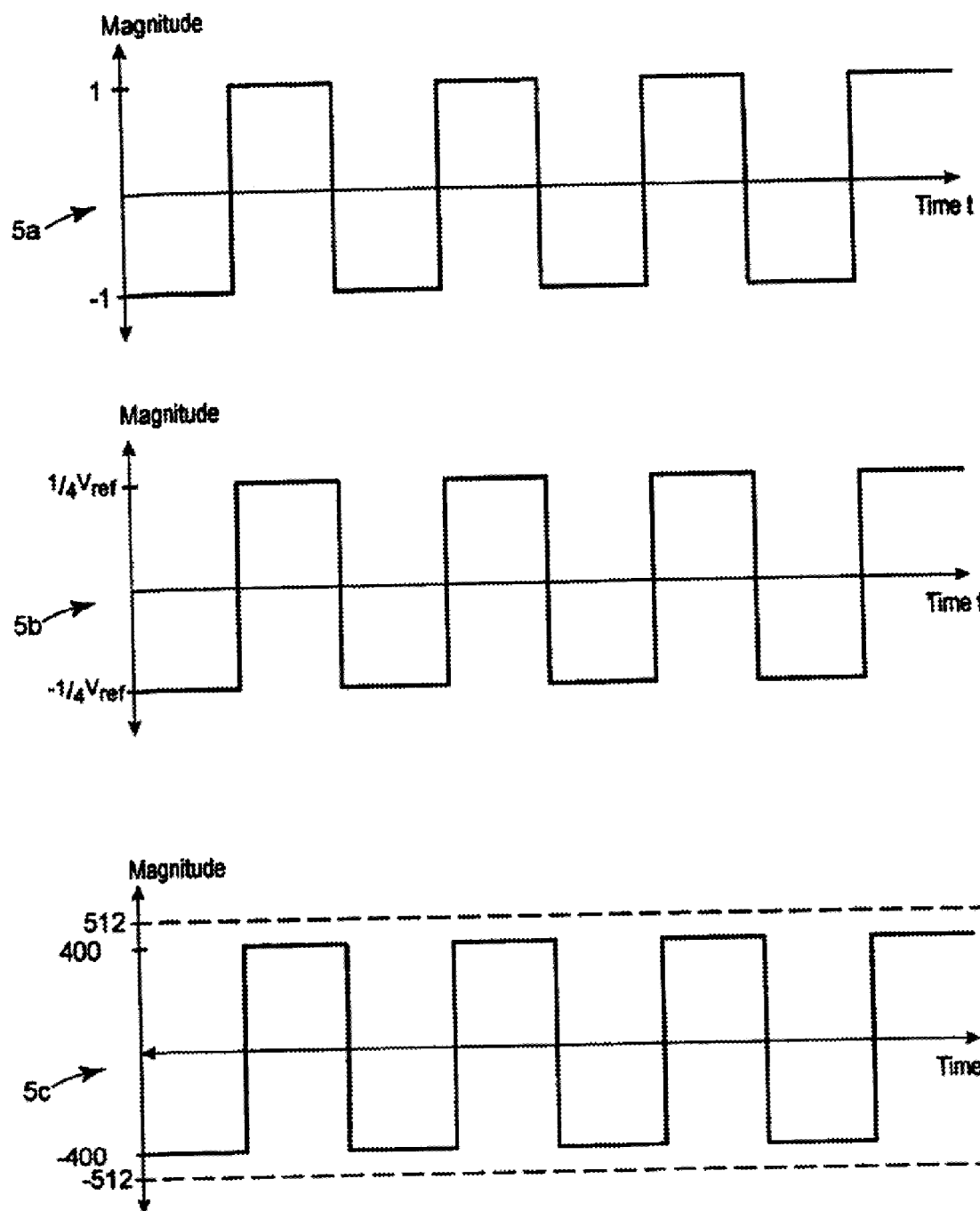
Figure 6:
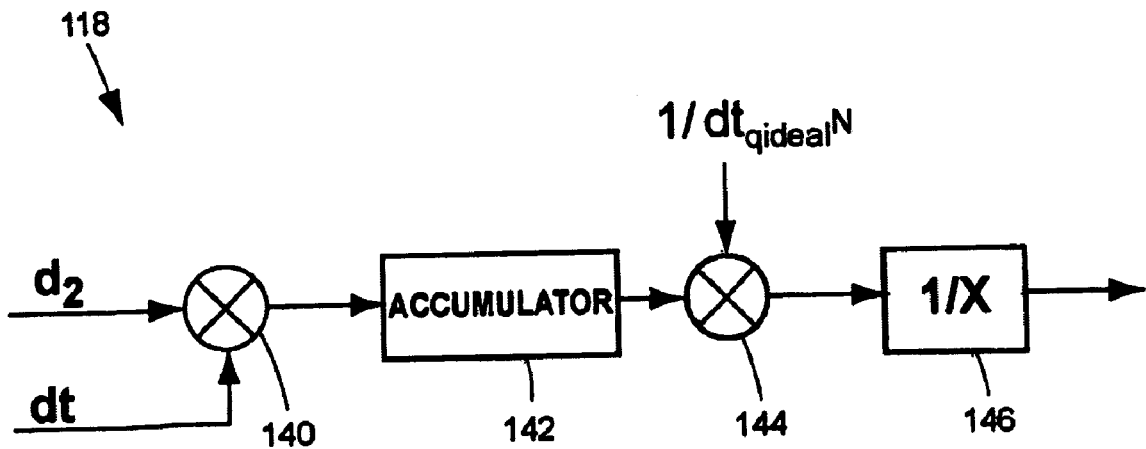
Figure 7:
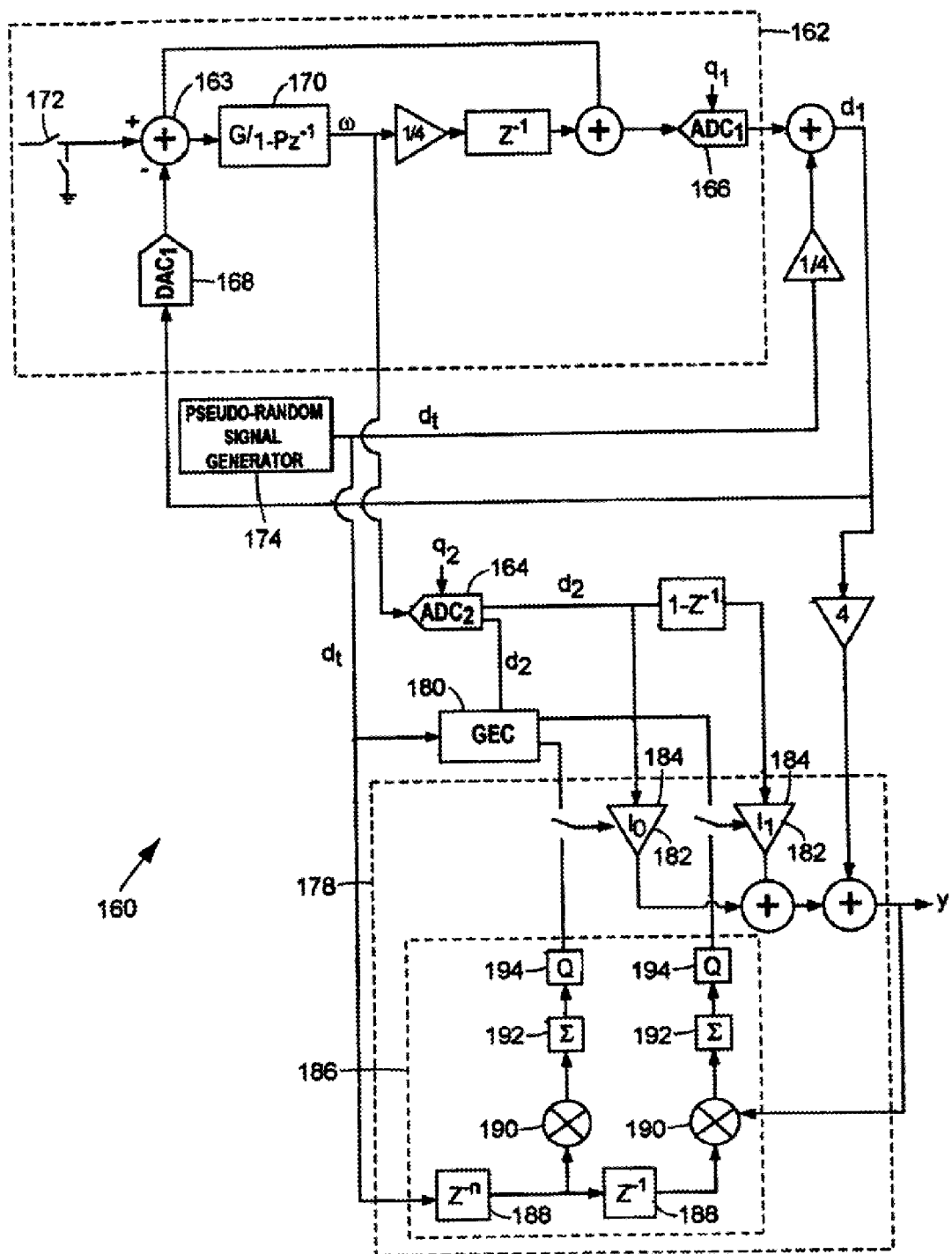
Figure 8:
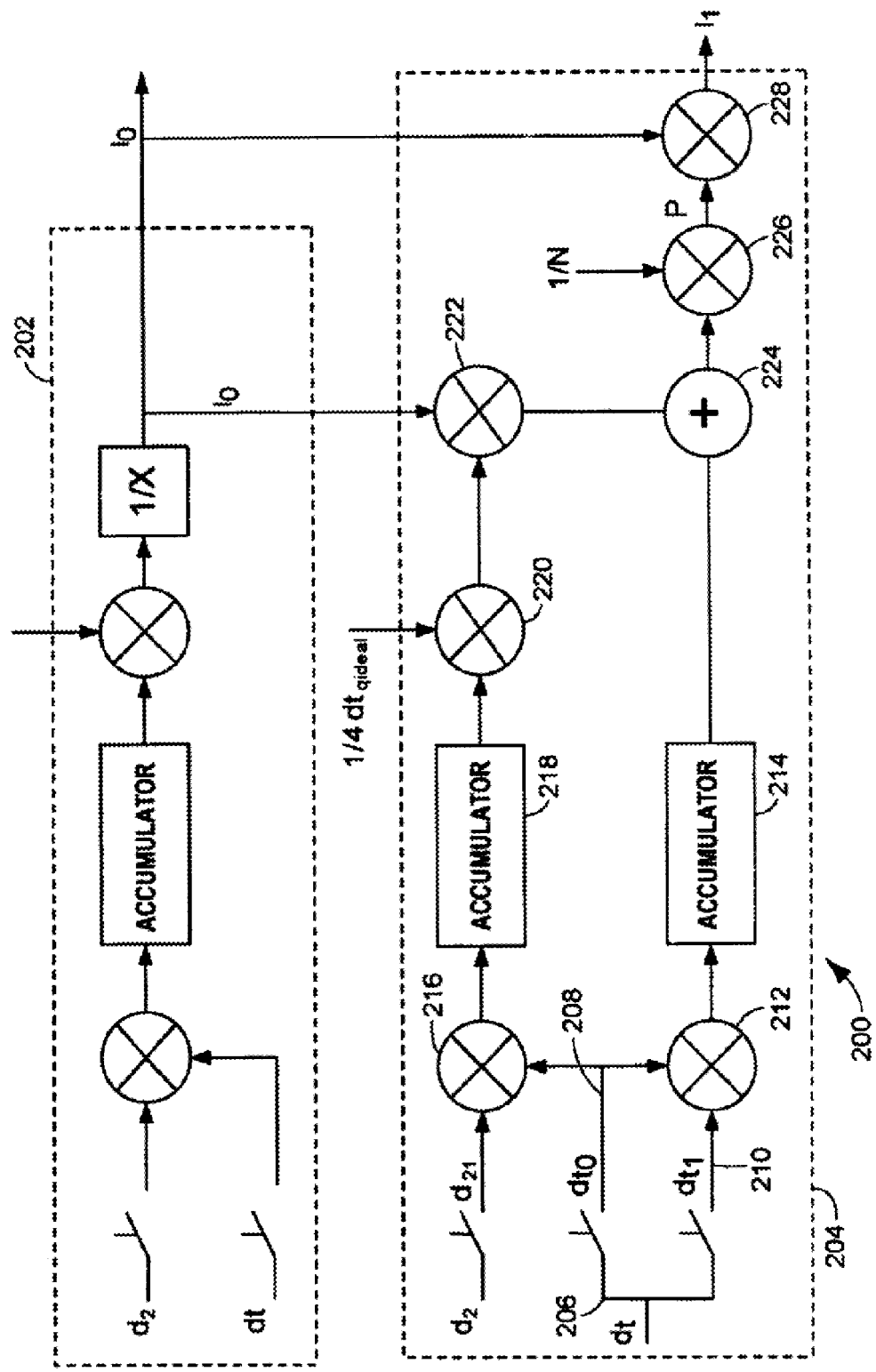
Figure 1:
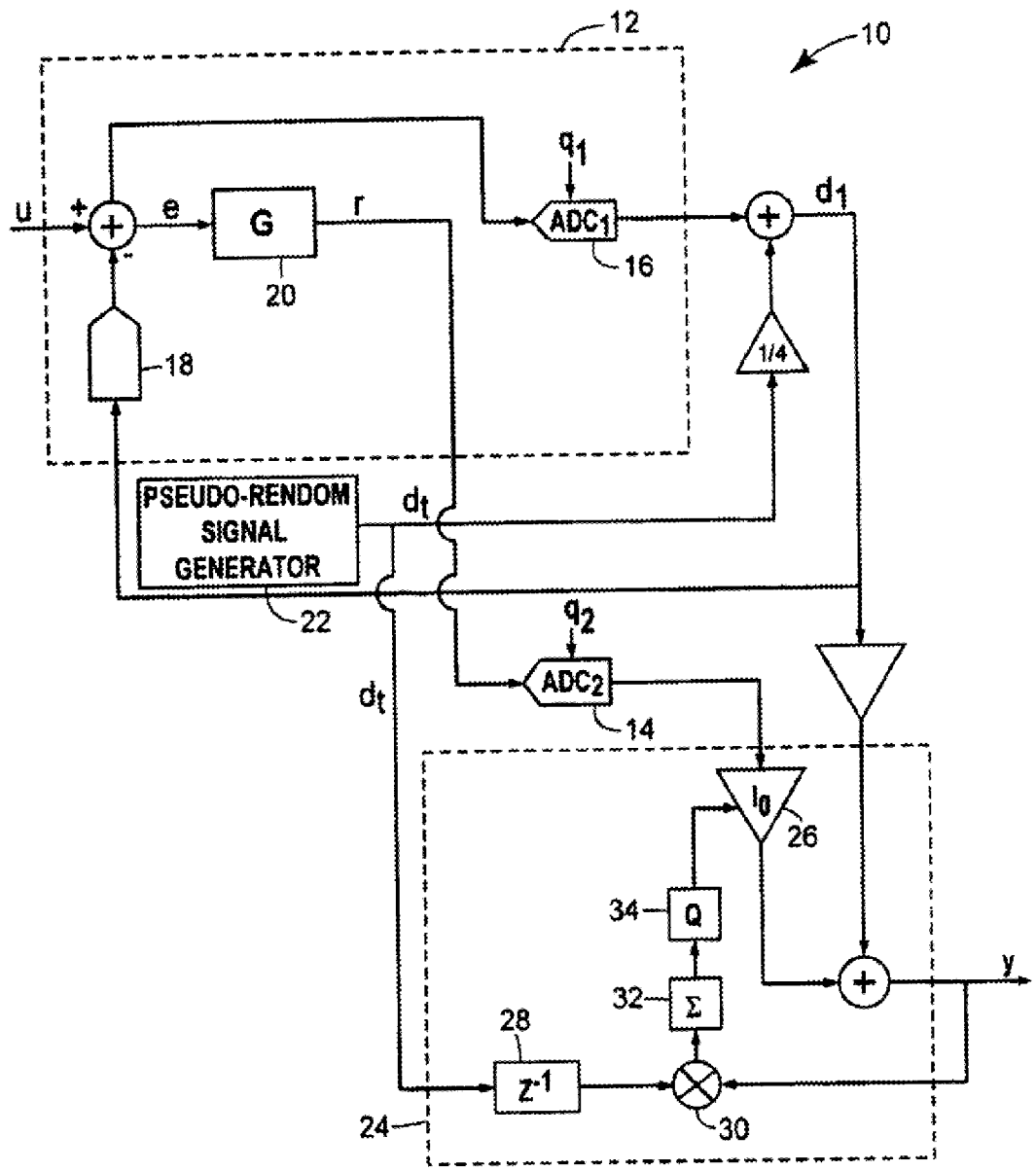
Figure 2:
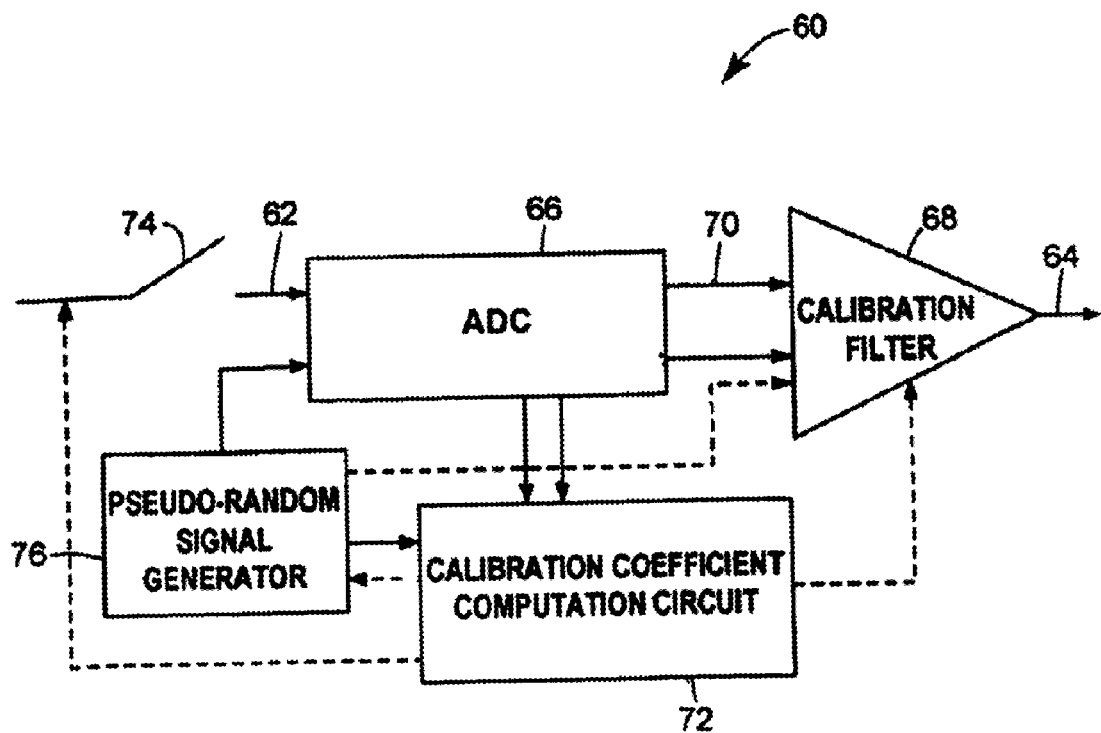
Figure 3:
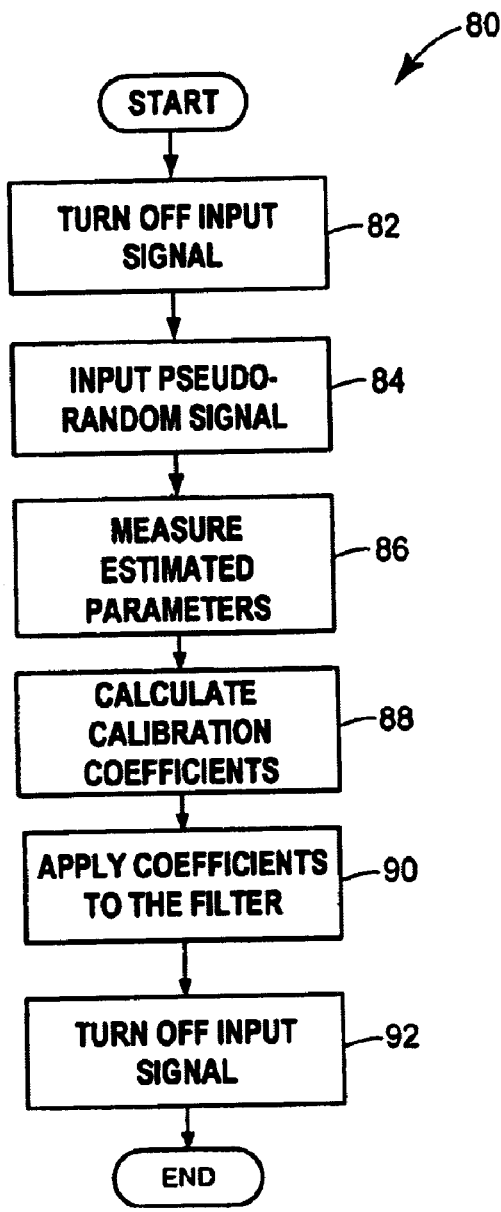
Figure 4:
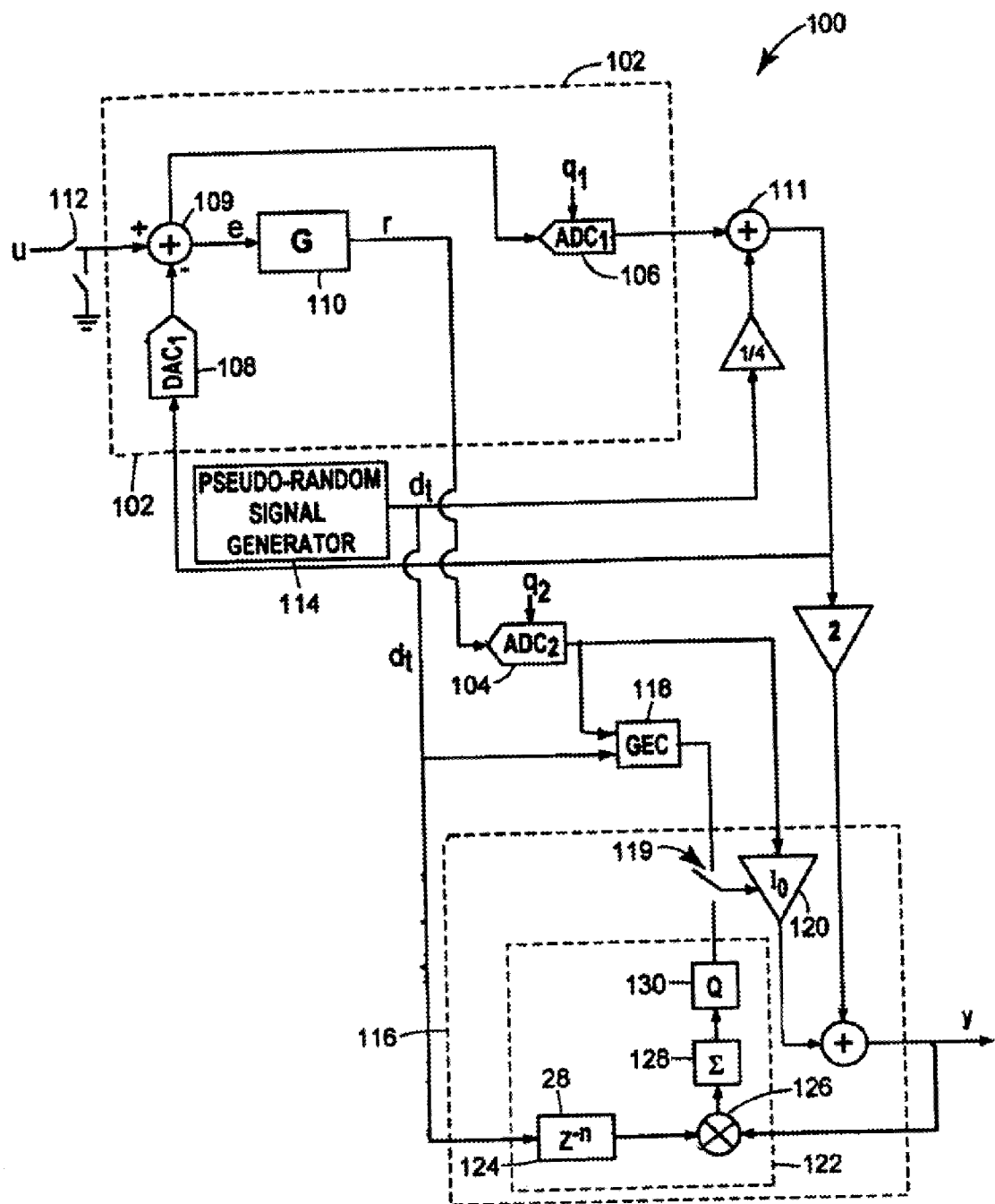
Figure 5:
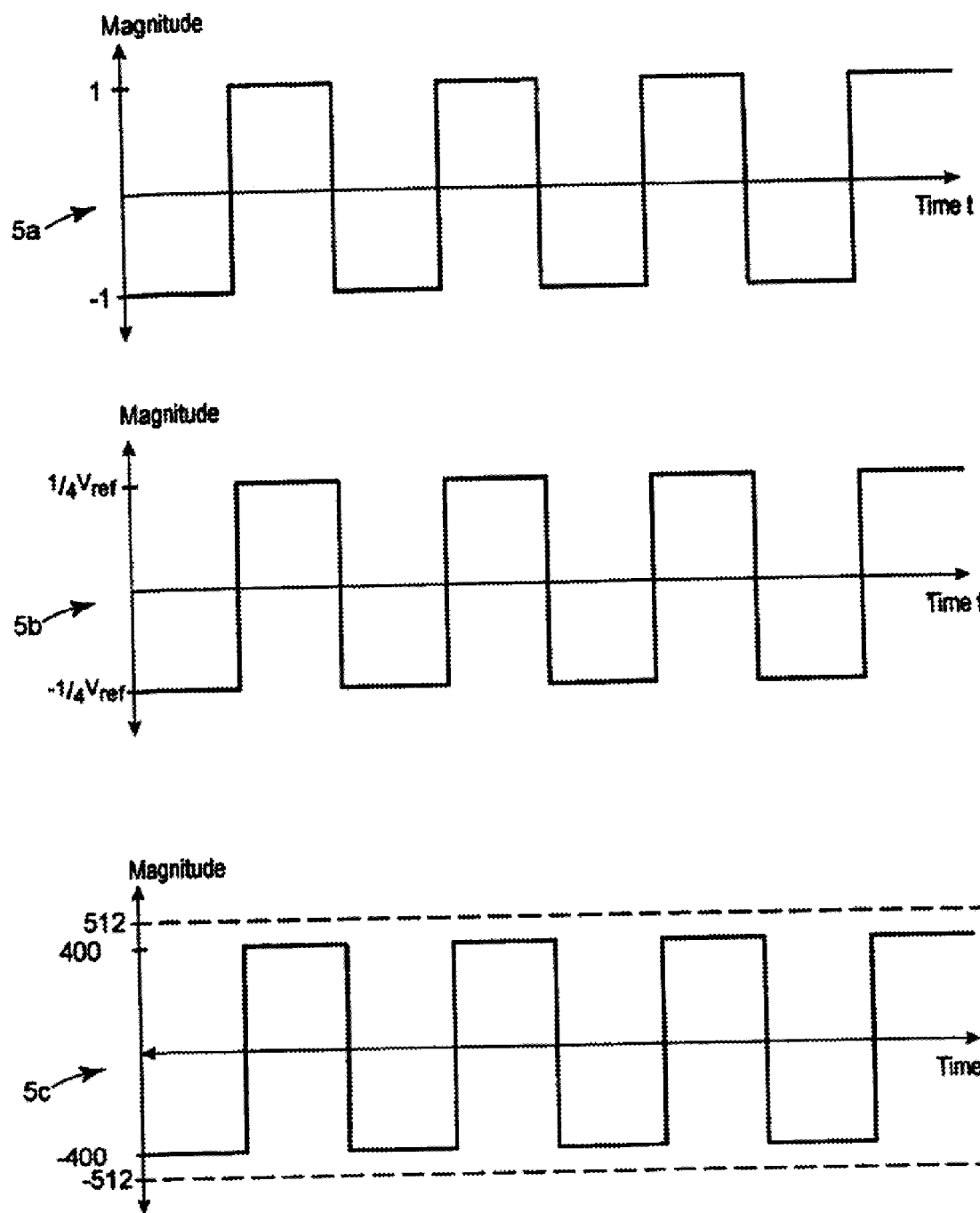
Figure 6:
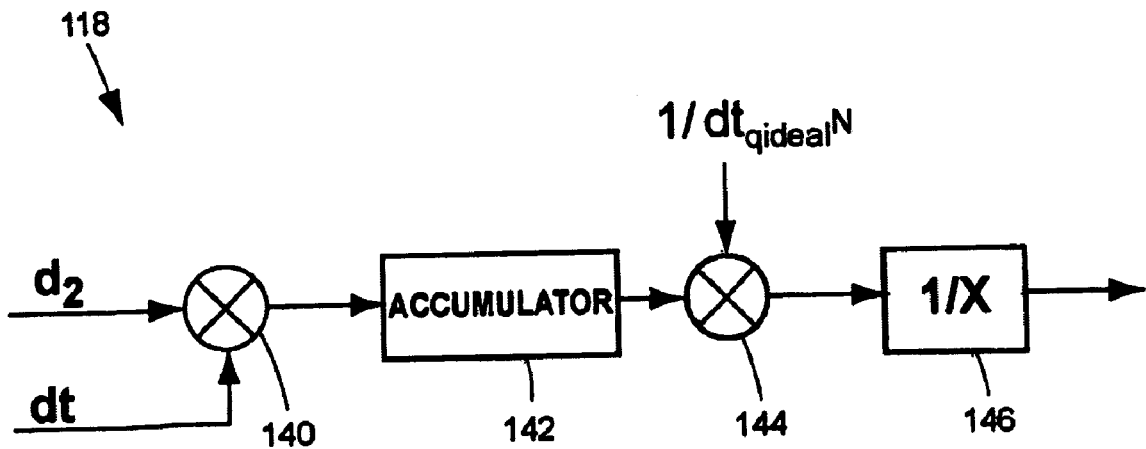
Figure 7:
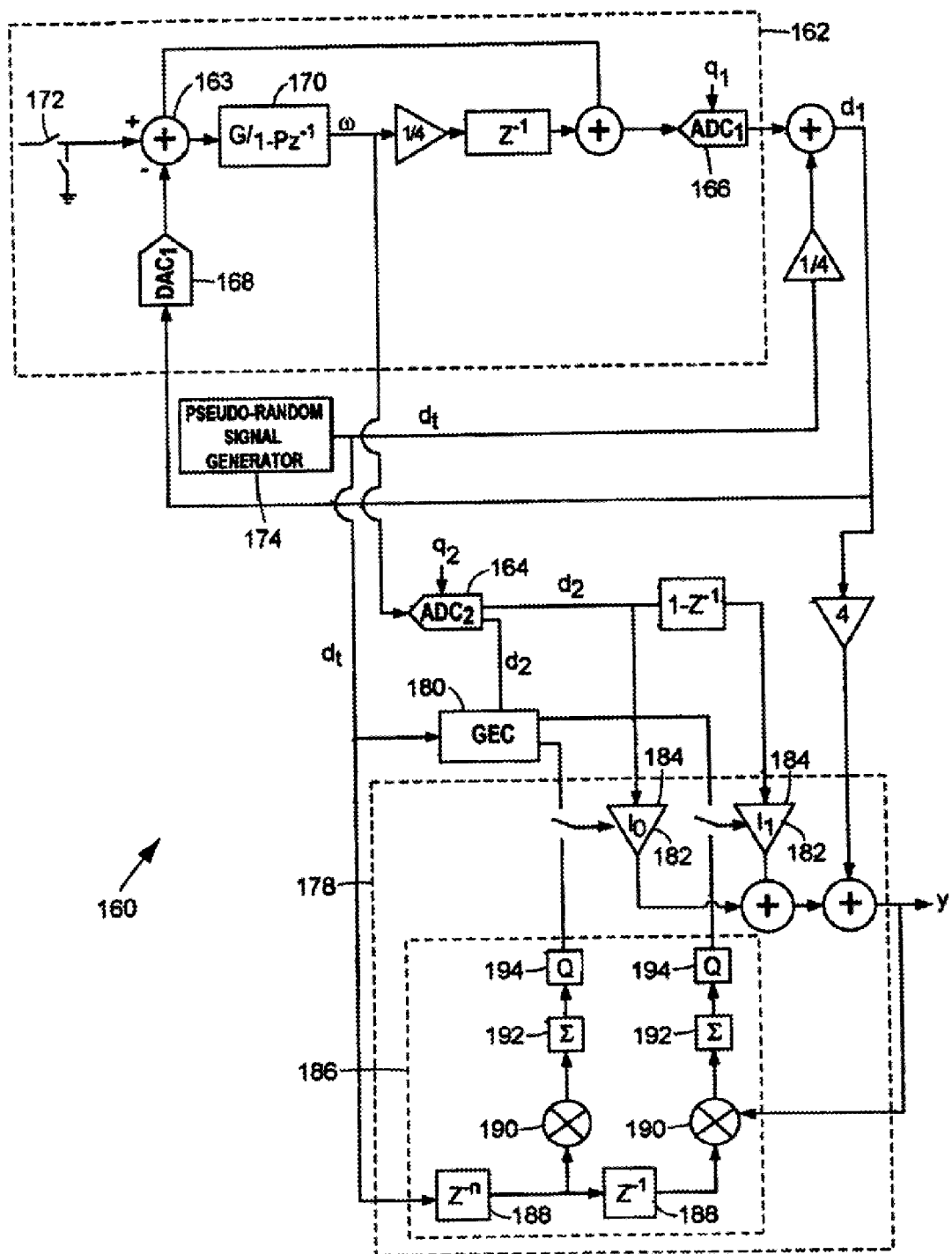
Figure 8:
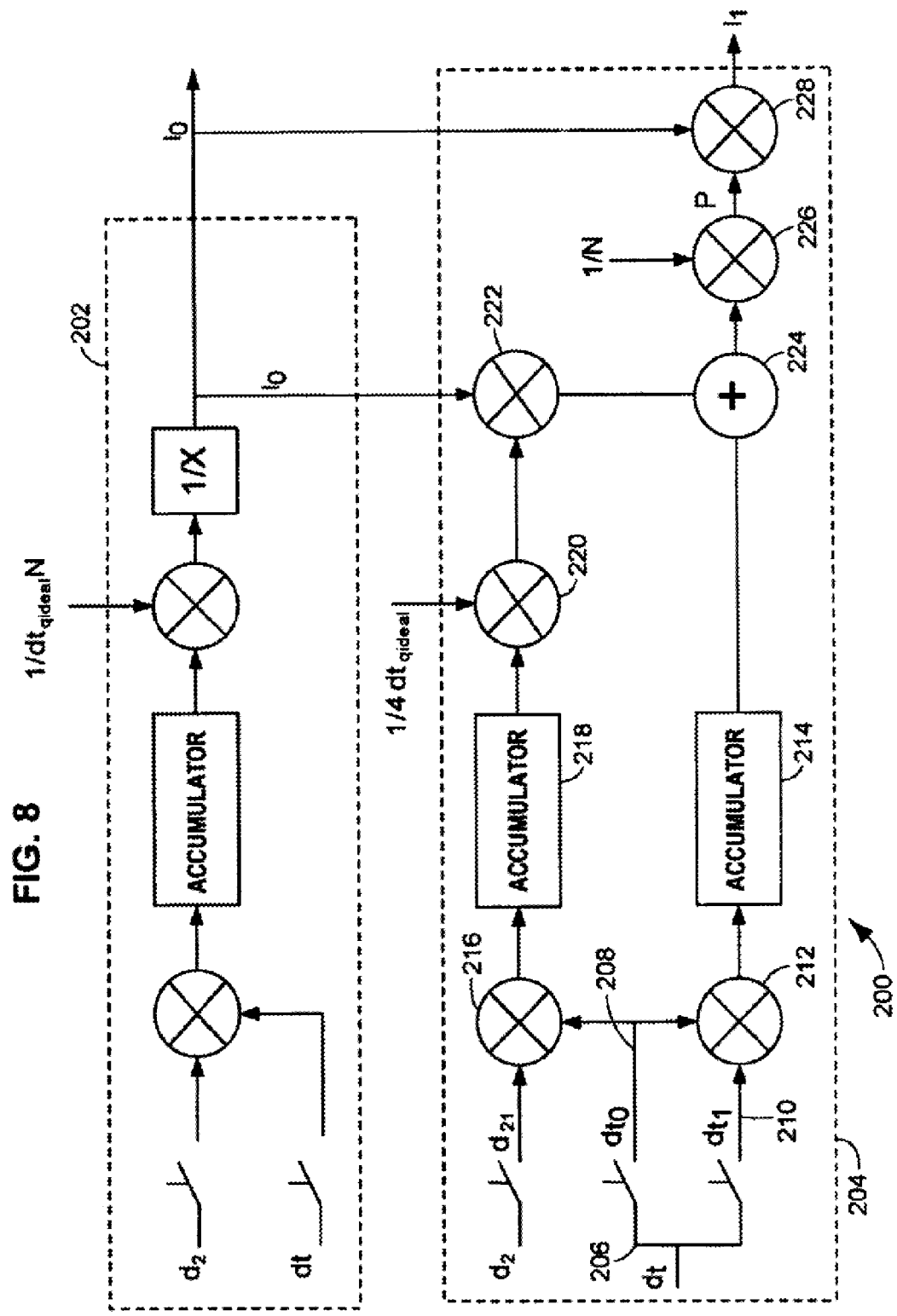

An implementation of the calibration coefficient computation circuit 180 is illustrated in FIG. 8 as a gain error correction (GEC) circuit 200. The GEC circuit 200 calculates values of the calibration coefficients $l_0$ and $l_1$ based on the values of estimated gain G and estimated integrator pole p. The GEC circuit 200 includes an $l_0$ computation circuit 202 and an $l_1$ computation circuit 204. The $l_0$ computation circuit 202 computes the coefficient $l_0$ for the gain filters 184, while the $l_1$ computation circuit 204 computes the coefficient $l_1$ for the gain filters 184.

The operation of the $l_0$ computation circuit 202 is similar to the operation of the GEC circuit 118 described in FIG. 6, and therefore it is not described in further detail here. The $l_1$ computation circuit 204 receives the value of $l_0$ as computed by the $l_0$ computation circuit 202 as an input. A switching device 206 controls input of the pseudo-random signal $d_r$ into the $l_1$ computation circuit 204. Specifically, the switching device 206 alternatively inputs the signal $d_r$ onto alternate input lines 208 and 210. Thus, for example, if at a time period $t_0$ a signal $d_{r0}$ is input onto the input line 208, at the next time period $t_1$, a signal $d_{r1}$ is input on the input line 210.

Subsequently, a first correlator 212 correlates the signal $d_r$ with its delayed signal, for example, the signal $d_{r0}$ is correlated with the signal $d_{r1}$. The output of the correlator 212 is summed by an accumulator 214. A correlator 216 correlates the signal $d_{r0}$ with the digital signal $d_{21}$, where $d_{21}$ is the digital signal $d_2$ delayed by one clock period. The output of the correlator 216 is accumulated by an accumulator 218. Subsequently, a multiplier 220 multiplies the output of the accumulator 218 by $1/(4d_{tqideal})$ and another multiplier 222 multiplies the output of the multiplier 220 with the output $l_0$ received from the $l_0$ computation circuit 202.

A summation circuit 224 adds the outputs of the multiplier 222 and the accumulator 214. Subsequently, another multiplier 226 multiplies the output of the summation circuit 224 by 1/N to generate an estimate of the integrator pole p. Finally a multiplier 228 uses the estimated value of the integrator pole p and the output $l_0$ received from the $l_0$ computation circuit 202 to generate an estimated value of the calibration coefficient $l_1$.

Although the forgoing text sets forth a detailed description of numerous different embodiments of the invention, it should be understood that the scope of the invention is defined by the words of the claims set forth at the end of this patent. The detailed description is to be construed as exemplary only and does not describe every possible embodiment of the invention because describing every possible embodiment would be impractical, if not impossible. Numerous alternative embodiments could be implemented, using either current technology or technology developed after the filing date of this patent, which would still fall within the scope of the claims defining the invention.

Thus, many modifications and variations may be made in the techniques and structures described and illustrated herein without departing from the spirit and scope of the present invention. Accordingly, it should be understood that the methods and apparatus described herein are illustrative only and are not limiting upon the scope of the invention.

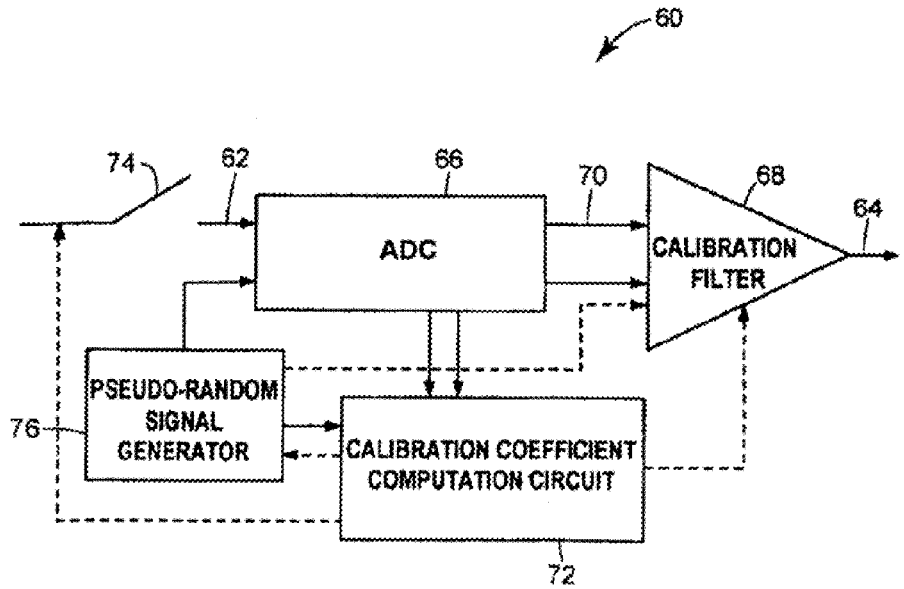

What is claimed is:

1. A method of calibrating an analog-to-digital converter circuit, comprising:
   disabling an input signal to the analog-to-digital converter circuit;
   inputting a pseudo-random signal to the analog-to-digital converter circuit;
   measuring at least one of estimated gain and estimated integrator pole of the analog-to-digital converter circuit; and
   calculating coefficients of a calibration filter used in the analog-to-digital converter circuit using at least one of the estimated gain and the estimated integrator pole.

2. A method of claim 1, further comprising:
   enabling the input signal of the analog-to-digital converter after calculating the coefficients of the calibration filter used in the analog-to-digital converter circuit; and
   operating the analog-to-digital converter circuit in a continuous calibration mode.

3. A method of claim 1, further comprising operating the calibration filter using the coefficients of the calibration filter.

4. A method of claim 3, wherein measuring the estimated gain of the analog-to-digital converter circuit comprises:
   multiplying a digitized residue of a first stage of the analog-to-digital converter circuit with the pseudo-random signal;
   accumulating a sum of the multiplication; and
   scaling the sum by an expected magnitude of the pseudo-random signal.

5. A method of claim 4, further comprising calibrating a second stage of the analog-to-digital converter circuit by multiplying a digitized residue of the second stage of the analog-to-digital converter circuit with the pseudo-random signal, accumulating a sum of the multiplication, and scaling the sum by an expected magnitude of the pseudo-random signal.

6. A method of claim 4, wherein a gain-error-correction circuit is used for multiplying a digitized residue of the first stage of the analog-to-digital converter circuit with the pseudo-random signal, for accumulating a sum of the multiplication, and for scaling the sum by an expected magnitude of the pseudo-random signal.

7. A method of claim 6, further comprising dividing an ideal gain of the analog-to-digital converter circuit by the estimated gain of the analog-to-digital converter circuit to determine a calibration coefficient of the calibration filter.

8. A method of claim 1, wherein the calibration filter is used to calibrate output of one of a MASH $\Delta_\Sigma$ analog-to-digital converter circuit and a pipelined analog-to-digital converter circuit.

9. A method of claim 8, further comprising:
measuring the estimated gain of the analog-to-digital converter circuit by:
resetting an integrator of the analog-to-digital converter circuit for every clock period;
multiplying a digitized residue of a first stage of the analog-to-digital converter circuit with the pseudo-random signal to get a first multiplication,
accumulating the first multiplication to get a first sum, and
scaling the first sum by an expected magnitude of the pseudo-random signal; and
measuring the integrator pole of the analog-to-digital converter circuit by:
resetting the integrator of the analog-to-digital converter circuit for every second clock period;
multiplying a digitized residue of a first stage of the analog-to-digital converter circuit with a memory of the pseudo-random signal to get a second multiplication,
accumulating the second multiplication to get a second sum,
accumulating a third sum of ratios of a sign of the pseudo-random signal and the sign of the memory of the pseudo-random signal,
subtracting the third sum from the second sum to get a first difference, and
scaling the first difference by a number of measurements.

10. A method of claim 9, further comprising dividing an ideal gain of the analog-to-digital converter circuit by the estimated gain to get a first calibration coefficient of the calibration filter.

11. A method of claim 10, further comprising multiplying the first coefficient of the calibration filter by the estimated integrator pole of the analog-to-digital converter circuit to get a second calibration coefficient of the calibration filter.

12. A method of measuring calibration coefficients of a calibration filter used in a pipelined analog-to-digital converter circuit, the pipelined analog-to-digital converter circuit having a first analog-to-digital converter, a second analog-to-digital converter and a digital-to analog converter in a feedback path of the first analog-to-digital converter, the method comprising:
disabling an input signal to the pipelined analog-to-digital converter circuit;
inputting a pseudo-random signal to the pipelined analog-to-digital converter circuit;
inputting a gained output of the digital-to-analog converter to the second analog-to-digital converter; and
inputting the pseudo-random signal and the output of the second analog-to-digital converter to a calibration coefficient computation circuit to thereby calculate calibration coefficients.

13. A method of claim 12, further comprising filtering an output of the second analog-to-digital converter using the calibration coefficients.

14. A method of claim 12, wherein the calibration coefficient computation circuit computes an estimated gain of the analog to digital converter circuit.

15. A method of claim 12, wherein the calibration coefficient computation circuit correlates an output of the second analog-to-digital converter with the pseudo-random signal.

16. A method of measuring calibration coefficients of a calibration filter used in a $\Delta_\Sigma$ analog-to-digital converter circuit, the $\Delta_\Sigma$ analog-to-digital converter circuit having a first analog-to-digital converter, a second analog-to-digital converter and a digital-to analog converter in a feed-back path of the first analog-to-digital converter, the method comprising:
disabling an input signal to the $\Delta_\Sigma$ analog-to-digital converter circuit;
inputting a pseudo-random signal to the $\Delta_\Sigma$ analog-to-digital converter circuit;
inputting an integrated output of the digital-to-analog converter to the second analog-to-digital converter; and
inputting the pseudo-random signal and the output of the second analog-to-digital converter to a calibration coefficient computation circuit to thereby calculate calibration coefficients.

17. A method of claim 16, wherein the calibration coefficient computation circuit computes an estimated gain and an estimated integrator pole of the $\Delta_\Sigma$ analog-to-digital converter circuit.

18. A method of claim 17, wherein the calibration coefficients include a first calibration coefficient equal to a ratio of an ideal gain of the $\Delta_\Sigma$ analog-to-digital converter circuit and the estimated gain of the $\Delta_\Sigma$ analog-to-digital converter circuit.

19. A method of claim 17, wherein the calibration coefficients include a second calibration coefficient equal to the first calibration coefficient multiplied by the estimated integrator pole of the $\Delta_\Sigma$ analog-to-digital converter circuit.

20. A method of claim 17, further comprising:
resetting an integrator of the analog-to-digital converter circuit for every clock period for calculating the estimated gain of the $\Delta_\Sigma$ analog-to-digital converter circuit; and
resetting an integrator of the analog-to-digital converter circuit for every second clock period for calculating the estimated gain of the $\Delta_\Sigma$ analog-to-digital converter circuit.

21. An analog-to-digital converter system for converting an analog input signal to a digital output signal, the circuit comprising:
an analog-to-digital converter circuit;
a switching device for turning on and turning off the analog input signal to the analog-to-digital converter circuit;
a pseudo-random signal generator providing a pseudo-random signal to the analog-to-digital converter circuit,
a calibration coefficient computation circuit to compute calibration coefficients of the analog-to-digital converter circuit; and
a calibration filter circuit for filtering the digital output signal according to the calibration coefficients.

22. An analog-to-digital converter system of claim 21, wherein the analog-to-digital converter circuit is one of a pipelined analog-to-digital converter circuit and a $\Delta_\Sigma$ analog-to-digital converter circuit.

23. An analog-to-digital converter system of claim 22, wherein the $\Delta_\Sigma$ analog-to-digital converter circuit is a MASH $\Delta_\Sigma$ analog-to-digital converter circuit having an integrator with one pole.

24. An analog-to-digital converter system of claim 21, wherein the calibration coefficient computation circuit includes a gain error correction circuit.

25. An analog-to-digital converter system of claim 21, wherein the gain error correction circuit includes a correlator, an accumulator and an inverter.

26. An analog-to-digital converter system of claim 25, wherein the calibration coefficient computation circuit computes at least one of an estimated gain of the analog-to-digital converter circuit and an estimated integrator pole of the analog-to-digital converter circuit.

27. An analog-to-digital converter system of claim 26, wherein the calibration coefficient computation circuit computes a first calibration coefficient as a ratio of an ideal gain of the analog-to-digital converter circuit and the estimated gain of the analog-to-digital converter circuit.

28. An analog-to-digital converter system of claim 27, wherein the calibration coefficient computation circuit computes a second calibration coefficient by multiplying the first calibration coefficient by the estimated integrator pole of the analog-to-digital converter circuit.

29. An analog-to-digital converter system of claim 21, wherein the switching device turns off the input analog signal during a startup phase of the analog-to-digital circuit and the calibration coefficient computation circuit computes the calibration coefficients during the startup phase.

30. An analog-to-digital converter system of claim 21, wherein the analog-to-digital converter circuit is a MASH $\Delta_\Sigma$ analog-to-digital converter circuit and the calibration coefficient computation circuit resets the integrator at one of (1) every clock period and (2) every second clock period.

31. A calibration coefficient computation circuit for computing calibration coefficients of a calibration filter used in an analog-to-digital converter circuit, the analog-to-digital circuit converting an analog input signal into a digital output signal, the calibration coefficient computation circuit comprising:
  a switching device adapted to turn on and turn off the analog input signal to the analog-to-digital converter and a pseudo-random signal generator adapted to input a pseudo-random signal to the analog-to-digital converter circuit, wherein the switching device turns of the analog input signal to the analog-to-digital converter circuit during a startup phase of the analog-to-digital converter circuit, the pseudo-random signal generator inputs a pseudo-random input signal into the analog-to-digital converter circuit during the startup phase and the calibration coefficient computation circuit computes the calibration coefficients of the calibration filter during the startup phase.

32. A calibration coefficient computation circuit of claim 31, wherein the calibration coefficient computation circuit includes a gain error correction circuit.

33. A calibration coefficient computation circuit of claim 31, wherein the calibration coefficient computation circuit computes at least one of an estimated gain of the analog-to-digital converter circuit and an estimated integrator pole of the analog-to-digital converter circuit.

34. A calibration coefficient computation circuit of claim 31, wherein the calibration coefficient computation circuit computes a first calibration coefficient of the calibration filter as a ratio of an ideal gain of the analog-to-digital converter circuit and the estimated gain of the analog-to-digital converter circuit.

35. A calibration coefficient computation circuit of claim 34, wherein the calibration coefficient computation circuit computes a second calibration coefficient of the calibration filter by multiplying the first calibration coefficient by the estimated integrator pole of the analog-to-digital converter circuit.

36. A calibration coefficient computation circuit of claim 32, wherein the gain error correction circuit includes a correlator, an accumulator and an inverter.

37. A calibration coefficient computation circuit of claim 32, further adapted to compute calibration coefficients of at least one of a pipelined analog-to-digital converter circuit and a $\Delta_\Sigma$ analog-to-digital converter circuit.

\* \* \* \* \*

UNITED STATES PATENT AND TRADEMARK OFFICE
CERTIFICATE OF CORRECTION

PATENT NO. : 6,970,120 B1  Page 1 of 9
APPLICATION NO. : 10/866438
DATED : November 29, 2005
INVENTOR(S) : Johnny Bjornsen It is certified that error appears in the above-identified patent and that said Letters Patent is hereby corrected as shown below:

In the Drawings:

Delete Figs. 1-8 and substitute the attached Figs. 1-8 therefor.

In the Claims:

At Column 13, line 39, "digital-to analog" should be -- digital-to-analog --.

At Column 13, line 65, "digital-to analog" should be -- digital-to-analog --.

At Column 15, line 29, "turns of" should be -- turns off --.

Signed and Sealed this

Twenty-third Day of September, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,970,120 B1 | |
| APPLICATION NO. | : 10/866438 | |
| DATED | : November 29, 2005 | |
| INVENTOR(S) | : Johnny Bjornsen | |

It is certified that error appears in the above-identified patent and that said Letters Patent is hereby corrected as shown below:

Delete the title page and substitute therefor the attached title page.

In the Drawings:

Delete Figs. 1-8 and substitute the attached Figs. 1-8 therefor.

In the Claims:

At Column 13, line 39, "digital-to analog" should be -- digital-to-analog --.

At Column 13, line 65, "digital-to analog" should be -- digital-to-analog --.

At Column 15, line 29, "turns of" should be -- turns off --.

This certificate supersedes the Certificate of Correction issued September 23, 2008.

Signed and Sealed this

Fourteenth Day of October, 2008

JON W. DUDAS
*Director of the United States Patent and Trademark Office*

(12) United States Patent
Bjornsen

(10) Patent No.: US 6,970,120 B1
(45) Date of Patent: Nov. 29, 2005

(54) METHOD AND APPARATUS FOR START-UP OF ANALOG-TO-DIGITAL CONVERTERS

(75) Inventor: Johnny Bjornsen, Trondheim (NO)

(73) Assignee: NORDIC Semiconductor ASA, Tiller (NO)

(*) Notice: Subject to any disclaimer, the term of this patent is extended or adjusted under 35 U.S.C. 154(b) by 0 days.

(21) Appl. No.: 10/866,438

(22) Filed: Jun. 12, 2004

(51) Int. Cl.⁷ ............................................. H03M 1/10
(52) U.S. Cl. ........................ 341/120; 341/155; 341/118
(58) Field of Search ........................ 341/120, 118, 155, 341/161

(56) References Cited

U.S. PATENT DOCUMENTS

| 5,471,209 A | * | 11/1995 | Sutterlin et al. | 341/143 |
| 6,348,885 B1 | * | 2/2002 | Munoz et al. | 341/120 |
| 6,417,794 B1 | * | 7/2002 | Munoz et al. | 341/120 |
| 6,486,806 B1 | * | 11/2002 | Munoz et al. | 341/120 |
| 6,839,650 B2 | * | 1/2005 | Sutton et al. | 702/123 |

* cited by examiner

Primary Examiner—Lam T. Mai
(74) Attorney, Agent, or Firm—Marshall, Gerstein & Borun LLP

(57) ABSTRACT

An analog-to-digital (ADC) converter circuit that converts an analog input signal into a digital output circuit includes a calibration coefficient computation circuit for computing calibration coefficients of a calibration filter. The calibration coefficient computation circuit includes a switching device adapted to switch the analog input signal delivered to the ADC circuit between on and off states, and includes a pseudo-random signal generator adapted to input a pseudo-random signal to the ADC circuit. During a start-up phase of the ADC circuit, the ADC circuit, the switching device turns off the analog input signal to the ADC circuit, the pseudo-random signal generator inputs a pseudo-random signal into the ADC circuit, and the calibration coefficient computation circuit computes the calibration coefficients of the calibration filter. This ADC circuit configuration reduces startup time for the calibration filter to only a few clock cycles.

37 Claims, 8 Drawing Sheets